US012695589B2

(12) United States Patent
Mathe et al.

(10) Patent No.: US 12,695,589 B2
(45) **Date of Patent: *Jul. 28, 2026**

(54) OBTAINING ACCURATE TIMING OF ANALOG TO DIGITAL CONVERTER SAMPLES IN CELLULAR MODEM

(71) Applicant: QUALCOMM Incorporated, San Diego, CA (US)

(72) Inventors: Lennart Karl-Axel Mathe, San Diego, CA (US); Brian Clarke Banister, San Diego, CA (US); Christos Komninakis, Solana Beach, CA (US); Minkui Liu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/609,676

(22) Filed: Mar. 19, 2024

(65) Prior Publication Data

US 2024/0223350 A1 Jul. 4, 2024

Related U.S. Application Data

(63) Continuation of application No. 17/659,469, filed on Apr. 15, 2022, now Pat. No. 11,968,288.

(51) Int. Cl.
| | |
|---|---|
| *H04L 7/00* | (2006.01) |
| *H03M 1/12* | (2006.01) |
| *H04W 56/00* | (2009.01) |

(52) U.S. Cl.
CPC ........ *H04L 7/0079* (2013.01); *H03M 1/1245* (2013.01); *H04W 56/005* (2013.01)

(58) Field of Classification Search
CPC .. H04L 7/0079; H03M 1/1245; H04W 56/005
USPC .......................................................... 375/340
See application file for complete search history.

(56) References Cited

U.S. PATENT DOCUMENTS

| | | | | |
|---|---|---|---|---|
| 4,962,380 | A | 10/1990 | Meadows | |
| 8,594,170 | B2 | 11/2013 | Mombers et al. | |
| 8,787,433 | B2 | 7/2014 | Chaudhuri et al. | |
| 10,509,104 | B1* | 12/2019 | Dato | G01S 13/87 |
| 2006/0071851 | A1* | 4/2006 | Graas | G01S 19/29 |
| | | | | 342/357.395 |

(Continued)

OTHER PUBLICATIONS

International Search Report and Written Opinion—PCT/US2023/ 062995—ISA/EPO—Jun. 26, 2023.

*Primary Examiner* — Leila Malek
(74) *Attorney, Agent, or Firm* — Weaver Austin Villeneuve & Sampson LLP

(57) ABSTRACT

An analog-to-digital converter (ADC) has been disclosed. In some implementations, the ADC is configured to generate ADC samples based on input signals and an ADC input clock. The ADC is further configured to generate at a first time point a synchronized start signal indicating a starting point of capturing the ADC samples. The start signal and a system clock can be synchronized at a second time point. At a third time point, a capturing sample clock for capturing the ADC samples is generated. The synchronized start signal and the capturing sample clock can be input to a counter to determine a time difference between the second and third time points. An ADC output timing of the ADC samples can be determined based on the time difference.

20 Claims, 11 Drawing Sheets

700

(56)  References Cited

U.S. PATENT DOCUMENTS

| 2011/0116578 | A1 | 5/2011 | Kuo et al. |
| 2016/0329907 | A1 | 11/2016 | Miki et al. |
| 2019/0273502 | A1* | 9/2019 | Khalid .................... G01S 7/032 |
| 2023/0336192 | A1 | 10/2023 | Mathe et al. |
| 2023/0336324 | A1 | 10/2023 | Mathe et al. |

* cited by examiner

110

140

145

105

133

120

135

130

160

170

180

100

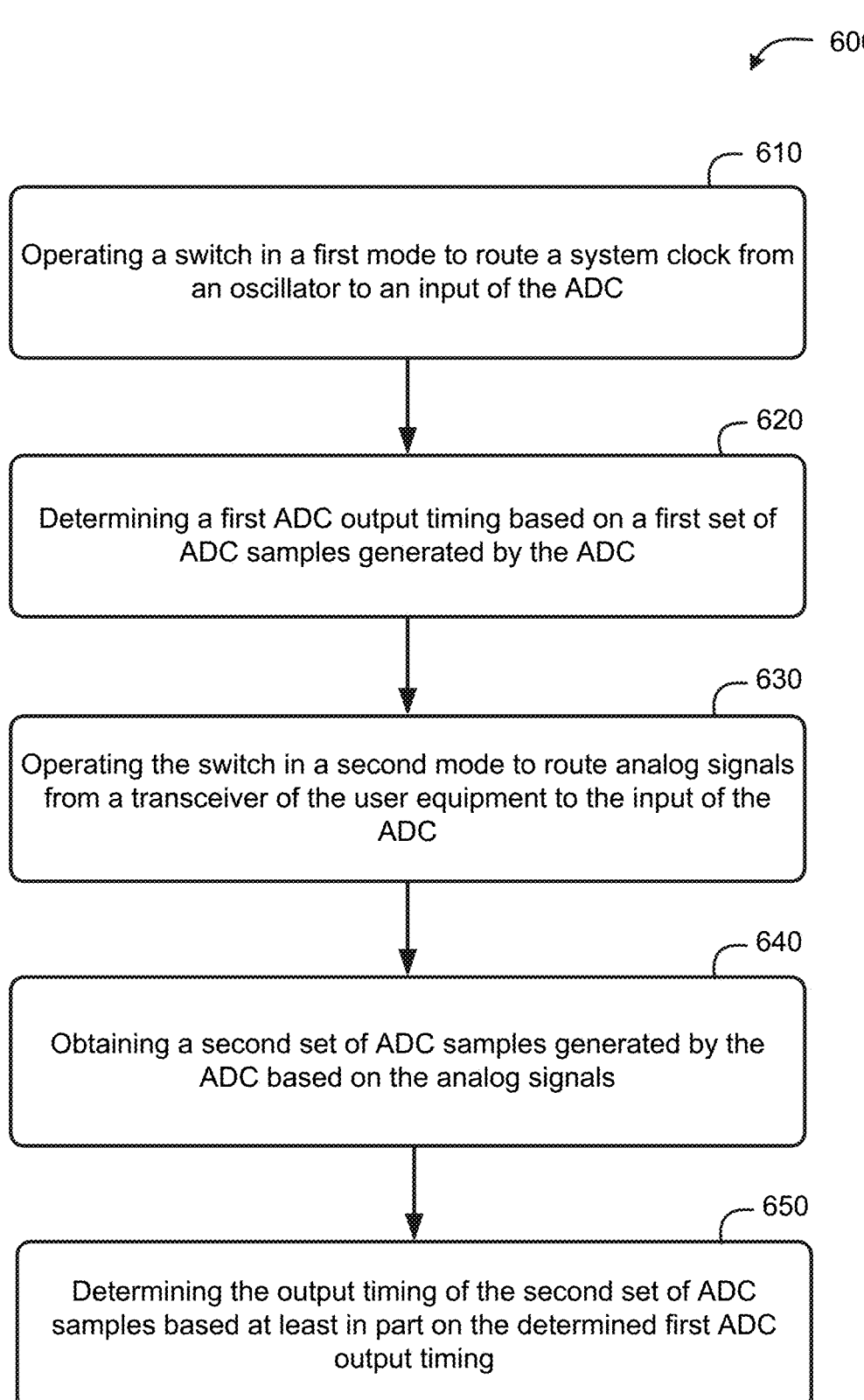

600

610

Operating a switch in a first mode to route a system clock from an oscillator to an input of the ADC

620

Determining a first ADC output timing based on a first set of ADC samples generated by the ADC

630

Operating the switch in a second mode to route analog signals from a transceiver of the user equipment to the input of the ADC

640

Obtaining a second set of ADC samples generated by the ADC based on the analog signals

650

Determining the output timing of the second set of ADC samples based at least in part on the determined first ADC output timing

FIG. 6

OBTAINING ACCURATE TIMING OF ANALOG TO DIGITAL CONVERTER SAMPLES IN CELLULAR MODEM

CROSS-REFERENCE TO RELATED APPLICATIONS

This application is a continuation of U.S. Non-Provisional application Ser. No. 17/659,469, filed Apr. 15, 2022, titled "OBTAINING ACCURATE TIMING OF ANALOG TO DIGITAL CONVERTER SAMPLES IN CELLULAR MODEM," which is herein incorporated by reference in its entirety for all purposes.

BACKGROUND

1. Field of Disclosure

The present disclosure relates generally to the field of wireless communications, and more specifically to systems and methods for obtaining accurate timing of analog to digital converter (ADC) samples in a cellular modem for accurately measuring the timing of RF signals traveling from a base station to the phone.

2. Description of Related Art

In a mobile communication network, positioning of a user equipment (UE) can involve measurements of a reference radio frequency (RF) signal determined by a receiving device. The accuracy of the positioning is impacted by the accuracy of the timing of these measurements. However, current wireless modems may have some uncertainty in the Analog-to-Digital Converter (ADC) timing due to the accumulated delay in the long ADC input clock generation path which will lead to the inaccuracy of the timing of these determined measurements and thus, negatively impact the accuracy of the positioning.

BRIEF SUMMARY

Techniques are provided in which accurate timing of analog to digital converter (ADC) samples in a cellular modem is obtained for accurately determining the measurements for positioning, based on the received RF signal.

An example method for determining an analog-to-digital converter (ADC) output timing in a user equipment may include obtaining a set of ADC samples generated by an ADC based on analog signals and an ADC input clock and generating, at a first time point, a start signal indicating a starting point of capturing the set of ADC samples. The method may also include synchronizing, at a second time point, the start signal and a system clock and generating, at a third time point, a capturing sample clock for capturing the set of ADC samples. The method may further include inputting the start signal and the capturing sample clock to a counter to determine a time difference between the second time point and the third time point and determining the ADC output timing of the set of ADC samples based on the time difference.

An example device may include one or more transceivers configured to receive analog signals and an analog-to-digital converter (ADC) configured to generate ADC samples. The device may also include one or more processors configured to obtain a set of ADC samples generated by an ADC based on analog signals and an ADC input clock and generate, at a first time point, a start signal indicating a starting point of capturing the set of ADC samples. The one or more processors may also be configured to synchronize, at a second time point, the start signal and a system clock and generate, at a third time point, a capturing sample clock for capturing the set of ADC samples. The one or more processors may further be configured to input the start signal and the capturing sample clock to a counter to determine a time difference between the second time point and the third time point and determine the ADC output timing of the set of ADC samples based on the time difference.

An example UE may include means for obtaining a set of ADC samples generated by an ADC based on analog signals and an ADC input clock and means for generating, at a first time point, a start signal indicating a starting point of capturing the set of ADC samples. The UE may also include means for synchronizing, at a second time point, the start signal and a system clock and means for generating, at a third time point, a capturing sample clock for capturing the set of ADC samples. The means may further include means for inputting the start signal and the capturing sample clock to a counter to determine a time difference between the second time point and the third time point and means for determining the ADC output timing of the set of ADC samples based on the time difference.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

FIG. 6 is a flow chart of determining an ADC output timing in a UE, according to an embodiment.

Figure 1:
FIG. 1 is a diagram of a positioning system, according to an embodiment.

Like reference symbols in the various drawings indicate like elements, in accordance with certain example implementations. In addition, multiple instances of an element may be indicated by following a first number for the element with a letter or a hyphen and a second number. For example, multiple instances of an element 110 may be indicated as 110-1, 110-2, 110-3 etc. or as 110a, 110b, 110c, etc. When referring to such an element using only the first number, any instance of the element is to be understood (e.g., element 110 in the previous example would refer to elements 110-1, 110-2, and 110-3 or to elements 110*a*, 110*b*, and 110*c*).

DETAILED DESCRIPTION

The following description is directed to certain implementations for the purposes of describing innovative aspects of various embodiments. However, a person having ordinary skill in the art will readily recognize that the teachings herein can be applied in a multitude of different ways. The described implementations may be implemented in any device, system, or network that is capable of transmitting and receiving radio frequency (RF) signals according to any communication standard, such as any of the Institute of Electrical and Electronics Engineers (IEEE) IEEE 802.11 standards (including those identified as Wi-Fi® technologies), the Bluetooth® standard, code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Rate Packet Data (HRPD), High Speed Packet Access (HSPA), High Speed Downlink Packet Access (HSDPA), High Speed Uplink Packet Access (HSUPA), Evolved High Speed Packet Access (HSPA+), Long Term Evolution (LTE), Advanced Mobile Phone System (AMPS), or other known signals that are used to communicate within a wireless, cellular or internet of things (IoT) network, such as a system utilizing 3G, 4G, 5G, 6G, or further implementations thereof, technology.

As used herein, an "RF signal" comprises an electromagnetic wave that transports information through the space between a transmitter (or transmitting device) and a receiver (or receiving device). As used herein, a transmitter may transmit a single "RF signal" or multiple "RF signals" to a receiver. However, the receiver may receive multiple "RF signals" corresponding to each transmitted RF signal due to the propagation characteristics of RF signals through multiple channels or paths.

Additionally, unless otherwise specified, references to "reference signals," "positioning reference signals," "reference signals for positioning," and the like may be used to refer to signals used for positioning of a user equipment (UE). As described in more detail herein, such signals may comprise any of a variety of signal types but may not necessarily be limited to a Positioning Reference Signal (PRS) as defined in relevant wireless standards.

In wireless communications (e.g., based on Fifth Generation (5G) New Radio (NR) mobile communication network), the location of a target UE can be determined based on the wireless propagation delay of a signal (e.g., a reference signal) sent from or received by the target UE. The wireless propagation delay of the signal is a time difference between the transmission of the signal by a transmitting device and the receipt of the signal at a receiving device (e.g., determined based on using sampled cross-correlation to determine a total delay between the transmitted waveform and the received waveform). The wireless propagation delay of a signal sent by a base station and received by a UE may be determined, for example, from an RTT measurement of the signal, in which the UE measures a time at which the signal is received and further transmits a response signal.

The accuracy of a determined propagation time may be impacted by an accuracy of a determination of when the signal was received by the UE.

An ADC is an important processing component in UE processing modules (e.g., the modem) configured to convert analog signals received from the receiver circuits to digital signals (e.g., sampling) based on an ADC clock (e.g., ADC input clock) for storing (e.g., capture samples in a first in first out (FIFO) memory/buffer) and/or further processing. Existing UE modems have uncertainty in determining the ADC output timing (e.g., the timing of the ADC output samples) due to the accumulated delay in the long ADC input clock generation path (e.g., generated based on a system clock). Accordingly, an accurate determination of output timing in ADC sampling module (e.g., the timing difference between the system clock and the ADC input clock) can help ensure an accurate determination of the location of a target UE.

As disclosed herein, in some embodiments, a switch is added at the input terminal of the ADC in addition to an existing ADC sampling system. Specifically, the ADC sampling module may first function in a timing determination mode (e.g., the switch is at a first position), where the system clock (e.g., generated by an oscillator and used as the reference clock) is directly routed to an input terminal of the ADC. The modem (e.g., a processor) may determine a first ADC output timing based on analyzing a first set of output samples generated using the system clock as the input signal. Then the ADC sampling module may function in a regular working mode (e.g., the switch is at a second position), where analog signals (e.g., RF signals) received by a transceiver of the UE are routed to the input terminal of the ADC and the ADC is configured to generate a second set of ADC samples using the analog signals as the input signal. Accordingly, the timing of the second set of samples (e.g., generated based on analog signals received from the transceiver) may be determined based on the first ADC output timing (e.g., the ADC output timing of the first set of output samples generated using the system clock).

In some other embodiments, an ADC output timing determining module may be added in addition to an existing ADC sampling system. The ADC output timing determining module may include a counter configured to determine the ADC output timing. The counter may take both the system clock and the ADC output clock as inputs to determine the timing of the ADC output samples, e.g., determining the difference between the ADC output clock and the system clock (e.g., using the system clock as the reference).

Additional details will follow after an initial description of relevant systems and technologies.

FIG. 1 is a simplified illustration of a positioning system 100 in which a UE 105, location server 160, and/or other components of the positioning system 100 can use the techniques provided herein for determining an estimated location of UE 105, specifically, for determining an ADC output timing in UE 105 according to an embodiment. The techniques described herein may be implemented by one or more components of the positioning system 100. The positioning system 100 can include: a UE 105; one or more satellites 110 (also referred to as space vehicles (SVs)) for a Global Navigation Satellite System (GNSS) such as the Global Positioning System (GPS), GLONASS, Galileo or Beidou; base stations 120; access points (APs) 130; location server 160; network 170; and external client 180. Generally put, the positioning system 100 can estimate a location of the UE 105 based on RF signals received by and/or sent from the UE 105 and known locations of other components (e.g., GNSS satellites 110, base stations 120, APs 130) transmitting and/or receiving the RF signals. Additional details regarding particular location estimation techniques are discussed in more detail with regard to FIG. 2.

It should be noted that FIG. 1 provides only a generalized illustration of various components, any or all of which may be utilized as appropriate, and each of which may be duplicated as necessary. Specifically, although only one UE 105 is illustrated, it will be understood that many UEs (e.g., hundreds, thousands, millions, etc.) may utilize the positioning system 100. Similarly, the positioning system 100 may include a larger or smaller number of base stations 120 and/or APs 130 than illustrated in FIG. 1. The illustrated connections that connect the various components in the positioning system 100 comprise data and signaling connections which may include additional (intermediary) components, direct or indirect physical and/or wireless connections, and/or additional networks. Furthermore, components may be rearranged, combined, separated, substituted, and/or omitted, depending on desired functionality. In some embodiments, for example, the external client 180 may be directly connected to location server 160. A person of ordinary skill in the art will recognize many modifications to the components illustrated.

Depending on desired functionality, the network 170 may comprise any of a variety of wireless and/or wireline networks. The network 170 can, for example, comprise any combination of public and/or private networks, local and/or wide-area networks, and the like. Furthermore, the network 170 may utilize one or more wired and/or wireless communication technologies. In some embodiments, the network 170 may comprise a cellular or other mobile network, a wireless local area network (WLAN), a wireless wide-area network (WWAN), and/or the Internet, for example. Examples of network 170 include a Long-Term Evolution (LTE) wireless network, a Fifth Generation (5G) wireless network (also referred to as New Radio (NR) wireless network or 5G NR wireless network), a Wi-Fi WLAN, and the Internet. LTE, 5G and NR are wireless technologies defined, or being defined, by the 3rd Generation Partnership Project (3GPP). Network 170 may also include more than one network and/or more than one type of network.

The base stations 120 and access points (APs) 130 may be communicatively coupled to the network 170. In some embodiments, the base station 120s may be owned, maintained, and/or operated by a cellular network provider, and may employ any of a variety of wireless technologies, as described herein below. Depending on the technology of the network 170, a base station 120 may comprise a node B, an Evolved Node B (eNodeB or eNB), a base transceiver station (BTS), a radio base station (RBS), an NR NodeB (gNB), a Next Generation eNB (ng-eNB), or the like. A base station 120 that is a gNB or ng-eNB may be part of a Next Generation Radio Access Network (NG-RAN) which may connect to a 5G Core Network (5GC) in the case that Network 170 is a 5G network. An AP 130 may comprise a Wi-Fi AP or a Bluetooth® AP or an AP having cellular capabilities (e.g., 4G LTE and/or 5G NR), for example. Thus, UE 105 can send and receive information with network-connected devices, such as location server 160, by accessing the network 170 via a base station 120 using a first communication link 133. Additionally or alternatively, because APs 130 also may be communicatively coupled with the network 170, UE 105 may communicate with network-connected and Internet-connected devices, including location server 160, using a second communication link 135, or via one or more other UEs 145.

As used herein, the term "base station" may generically refer to a single physical transmission point, or multiple co-located physical transmission points, which may be located at a base station 120. A Transmission Reception Point (TRP) (also known as transmit/receive point) corresponds to this type of transmission point, and the term "TRP" may be used interchangeably herein with the terms "gNB," "ng-eNB," and "base station." In some cases, a base station 120 may comprise multiple TRPs—e.g. with each TRP associated with a different antenna or a different antenna array for the base station 120. Physical transmission points may comprise an array of antennas of a base station 120 (e.g., as in a Multiple Input-Multiple Output (MIMO) system and/or where the base station employs beamforming). The term "base station" may additionally refer to multiple non-co-located physical transmission points, the physical transmission points may be a Distributed Antenna System (DAS) (a network of spatially separated antennas connected to a common source via a transport medium) or a Remote Radio Head (RRH) (a remote base station connected to a serving base station).

As used herein, the term "cell" may generically refer to a logical communication entity used for communication with a base station 120, and may be associated with an identifier for distinguishing neighboring cells (e.g., a Physical Cell Identifier (PCID), a Virtual Cell Identifier (VCID)) operating via the same or a different carrier. In some examples, a carrier may support multiple cells, and different cells may be configured according to different protocol types (e.g., Machine-Type Communication (MTC), Narrowband Internet-of-Things (NB-IoT), Enhanced Mobile Broadband (eMBB), or others) that may provide access for different types of devices. In some cases, the term "cell" may refer to a portion of a geographic coverage area (e.g., a sector) over which the logical entity operates.

The location server 160 may comprise a server and/or other computing device configured to determine an estimated location of UE 105 and/or provide data (e.g., "assistance data") to UE 105 to facilitate location measurement and/or location determination by UE 105. According to some embodiments, location server 160 may comprise a Home Secure User Plane Location (SUPL) Location Platform (H-SLP), which may support the SUPL user plane (UP) location solution defined by the Open Mobile Alliance (OMA) and may support location services for UE 105 based on subscription information for UE 105 stored in location server 160. In some embodiments, the location server 160 may comprise, a Discovered SLP (D-SLP) or an Emergency SLP (E-SLP). The location server 160 may also comprise an Enhanced Serving Mobile Location Center (E-SMLC) that supports location of UE 105 using a control plane (CP) location solution for LTE radio access by UE 105. The location server 160 may further comprise a Location Management Function (LMF) that supports location of UE 105 using a control plane (CP) location solution for NR or LTE radio access by UE 105.

In a CP location solution, signaling to control and manage the location of UE 105 may be exchanged between elements of network 170 and with UE 105 using existing network interfaces and protocols and as signaling from the perspective of network 170. In a UP location solution, signaling to control and manage the location of UE 105 may be exchanged between location server 160 and UE 105 as data (e.g. data transported using the Internet Protocol (IP) and/or Transmission Control Protocol (TCP)) from the perspective of network 170.

As previously noted (and discussed in more detail below), the estimated location of UE 105 may be based on measurements of RF signals sent from and/or received by the UE 105. In particular, these measurements can provide information regarding the relative distance and/or angle of the UE 105 from one or more components in the positioning system 100 (e.g., GNSS satellites 110, APs 130, base stations 120). The estimated location of the UE 105 can be estimated geometrically (e.g., using multiangulation and/or multilateration), based on the distance and/or angle measurements, along with known position of the one or more components.

Although terrestrial components such as APs 130 and base stations 120 may be fixed, embodiments are not so limited. Mobile components may be used. For example, in some embodiments, a location of the UE 105 may be estimated at least in part based on measurements of RF signals 140 communicated between the UE 105 and one or more other UEs 145, which may be mobile or fixed. When or more other UEs 145 are used in the position determination of a particular UE 105, the UE 105 for which the position is to be determined may be referred to as the "target UE," and each of the one or more other UEs 145 used may be referred to as an "anchor UE." For position determination of a target UE, the respective positions of the one or more anchor UEs may be known and/or jointly determined with the target UE. Direct communication between the one or more other UEs 145 and UE 105 may comprise sidelink and/or similar Device-to-Device (D2D) communication technologies. Sidelink, which is defined by 3GPP, is a form of D2D communication under the cellular-based LTE and NR standards.

An estimated location of UE 105 can be used in a variety of applications—e.g. to assist direction finding or navigation for a user of UE 105 or to assist another user (e.g. associated with external client 180) to locate ULE 105. A "location" is also referred to herein as a "location estimate", "estimated location", "location", "position", "position estimate", "position fix", "estimated position", "location fix" or "fix". The process of determining a location may be referred to as "positioning," "position determination," "location determination," or the like. A location of UE 105 may comprise an absolute location of UE 105 (e.g. a latitude and longitude and possibly altitude) or a relative location of UE 105 (e.g. a location expressed as distances north or south, east or west and possibly above or below some other known fixed location (including, e.g., the location of a base station 120 or AP 130) or some other location such as a location for UE 105 at some known previous time, or a location of another UE 145 at some known previous time). A location may be specified as a geodetic location comprising coordinates which may be absolute (e.g. latitude, longitude and optionally altitude), relative (e.g. relative to some known absolute location) or local (e.g. X, Y and optionally Z coordinates according to a coordinate system defined relative to a local area such a factory, warehouse, college campus, shopping mall, sports stadium or convention center). A location may instead be a civic location and may then comprise one or more of a street address (e.g. including names or labels for a country, state, county, city, road and/or street, and/or a road or street number), and/or a label or name for a place, building, portion of a building, floor of a building, and/or room inside a building etc. A location may further include an uncertainty or error indication, such as a horizontal and possibly vertical distance by which the location is expected to be in error or an indication of an area or volume (e.g. a circle or ellipse) within which UE 105 is expected to be located with some level of confidence (e.g. 95% confidence).

The external client 180 may be a web server or remote application that may have some association with UE 105 (e.g. may be accessed by a user of UE 105) or may be a server, application, or computer system providing a location service to some other user or users which may include obtaining and providing the location of UE 105 (e.g. to enable a service such as friend or relative finder, or child or pet location). Additionally or alternatively, the external client 180 may obtain and provide the location of UE 105 to an emergency services provider, government agency, etc.

Figure 2:
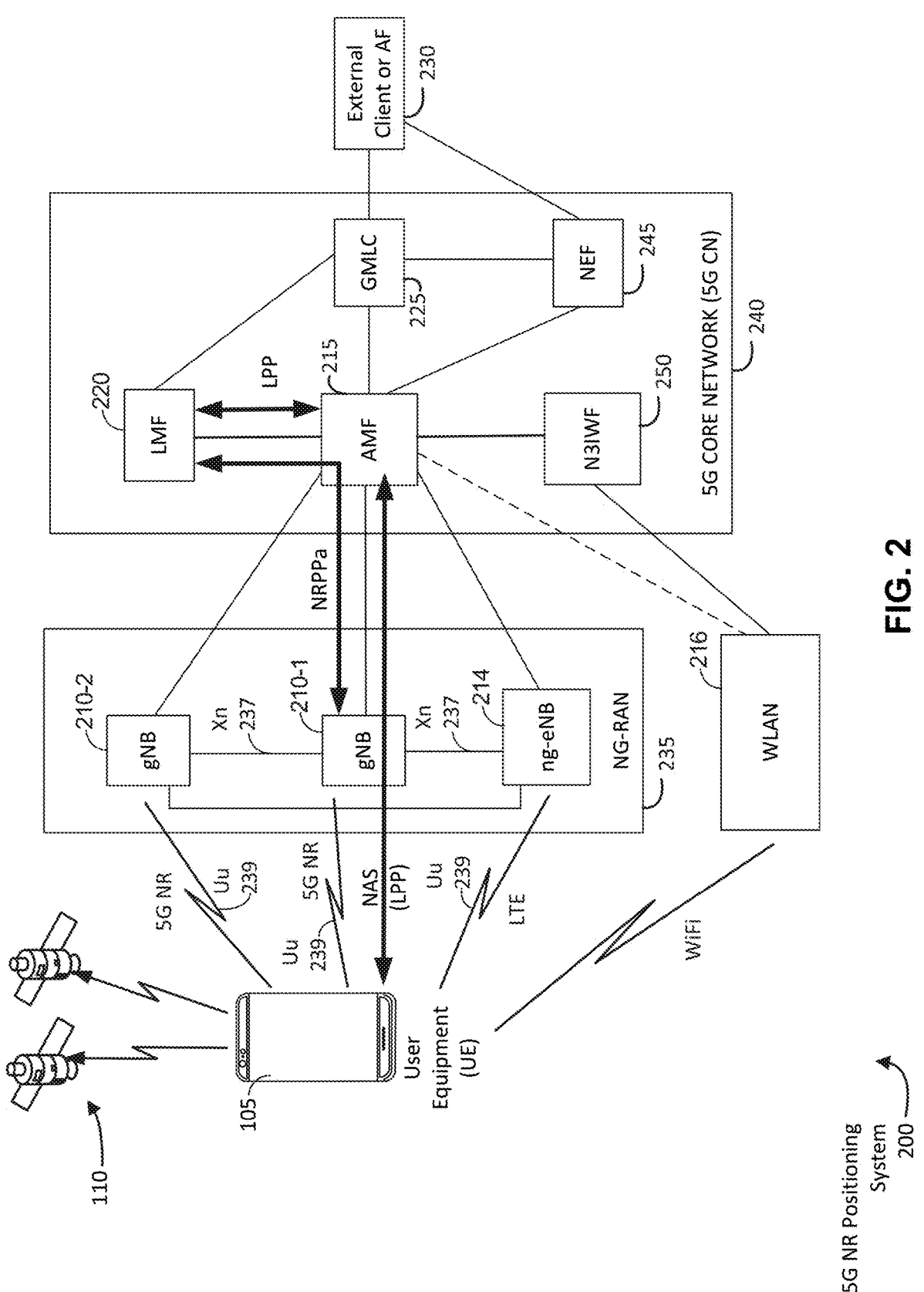
FIG. 2 is a diagram of a 5th Generation (5G) New Radio (NR) positioning system, illustrating an embodiment of a positioning system (e.g., the positioning system of FIG. 1) implemented within a 5G NR communication system.

As previously noted, the example positioning system 100 can be implemented using a wireless communication network, such as an LTE-based or 5G NR-based network. FIG. 2 shows a diagram of a 5G NR positioning system 200, illustrating an embodiment of a positioning system (e.g., positioning system 100) implementing 5G NR. The 5G NR positioning system 200 may be configured to determine the location of a UE 105 by using access nodes, which may include NR NodeB (gNB) 210-1 and 210-2 (collectively and generically referred to herein as gNBs 210), ng-eNB 214, and/or WLAN 216 to implement one or more positioning methods. The gNBs 210 and/or the ng-eNB 214 may correspond with base stations 120 of FIG. 1, and the WLAN 216 may correspond with one or more access points 130 of FIG. 1. Optionally, the 5G NR positioning system 200 additionally may be configured to determine the location of a UE 105 by using an LMF 220 (which may correspond with location server 160) to implement the one or more positioning methods. Here, the 5G NR positioning system 200 comprises a UE 105, and components of a 5G NR network comprising a Next Generation (NG) Radio Access Network (RAN) (NG-RAN) 235 and a 5G Core Network (5G CN) 240. A 5G network may also be referred to as an NR network; NG-RAN 235 may be referred to as a 5G RAN or as an NR RAN; and 5G CN 240 may be referred to as an NG Core network. The 5G NR positioning system 200 may further utilize information from GNSS satellites 110 from a GNSS system like Global Positioning System (GPS) or similar system (e.g. GLONASS, Galileo, Beidou, Indian Regional Navigational Satellite System (IRNSS)). Additional components of the 5G NR positioning system 200 are described below. The 5G NR positioning system 200 may include additional or alternative components.

It should be noted that FIG. 2 provides only a generalized illustration of various components, any or all of which may be utilized as appropriate, and each of which may be duplicated or omitted as necessary. Specifically, although only one UE 105 is illustrated, it will be understood that many UEs (e.g., hundreds, thousands, millions, etc.) may utilize the 5G NR positioning system 200. Similarly, the 5G NR positioning system 200 may include a larger (or smaller) number of GNSS satellites 110, gNBs 210, ng-eNBs 214, Wireless Local Area Networks (WLANs) 216, Access and mobility Management Functions (AMF)s 215, external clients 230, and/or other components. The illustrated connections that connect the various components in the 5G NR positioning system 200 include data and signaling connections which may include additional (intermediary) components, direct or indirect physical and/or wireless connections, and/or additional networks. Furthermore, components may be rearranged, combined, separated, substituted, and/or omitted, depending on desired functionality.

The UE 105 may comprise and/or be referred to as a device, a mobile device, a wireless device, a mobile terminal, a terminal, a mobile station (MS), a Secure User Plane Location (SUPL)-Enabled Terminal (SET), or by some other name. Moreover, UE 105 may correspond to a cellphone, smartphone, laptop, tablet, personal data assistant (PDA), navigation device, Internet of Things (IoT) device, or some other portable or moveable device. Typically, though not necessarily, the UE 105 may support wireless communication using one or more Radio Access Technologies (RATs) such as using GSM, CDMA, W-CDMA, LTE, High Rate Packet Data (HRPD), IEEE 802.11 Wi-Fi®, Bluetooth, Worldwide Interoperability for Microwave Access (WiMAX™), 5G NR (e.g., using the NG-RAN 235 and 5G CN 240), etc. The UE 105 may also support wireless communication using a WLAN 216 which (like the one or more RATs, and as previously noted with respect to FIG. 1) may connect to other networks, such as the Internet. The use of one or more of these RATs may allow the UE 105 to communicate with an external client 230 (e.g., via elements of 5G CN 240 not shown in FIG. 2, or possibly via a Gateway Mobile Location Center (GMLC) 225) and/or allow the external client 230 to receive location information regarding the UE 105 (e.g., via the GMLC 225). The external client 230 of FIG. 2 may correspond to external client 180 of FIG. 1, as implemented in or communicatively coupled with a 5G NR network.

The UE 105 may include a single entity or may include multiple entities, such as in a personal area network where a user may employ audio, video and/or data I/O devices, and/or body sensors and a separate wireline or wireless modem. An estimate of a location of the UE 105 may be referred to as a location, location estimate, location fix, fix, position, position estimate, or position fix, and may be geodetic, thus providing location coordinates for the UE 105 (e.g., latitude and longitude), which may or may not include an altitude component (e.g., height above sea level, height above or depth below ground level, floor level or basement level). Alternatively, a location of the UE 105 may be expressed as a civic location (e.g., as a postal address or the designation of some point or small area in a building such as a particular room or floor). A location of the UE 105 may also be expressed as an area or volume (defined either geodetically or in civic form) within which the UE 105 is expected to be located with some probability or confidence level (e.g., 67%, 95%, etc.). A location of the UE 105 may further be a relative location comprising, for example, a distance and direction or relative X, Y (and Z) coordinates defined relative to some origin at a known location which may be defined geodetically, in civic terms, or by reference to a point, area, or volume indicated on a map, floor plan or building plan. In the description contained herein, the use of the term location may comprise any of these variants unless indicated otherwise. When computing the location of a UE, it is common to solve for local X, Y, and possibly Z coordinates and then, if needed, convert the local coordinates into absolute ones (e.g. for latitude, longitude and altitude above or below mean sea level).

Base stations in the NG-RAN 235 shown in FIG. 2 may correspond to base stations 120 in FIG. 1 and may include gNBs 210. Pairs of gNBs 210 in NG-RAN 235 may be connected to one another (e.g., directly as shown in FIG. 2 or indirectly via other gNBs 210). The communication interface between base stations (gNBs 210 and/or ng-eNB 214) may be referred to as an Xn interface 237. Access to the 5G network is provided to UE 105 via wireless communication between the UE 105 and one or more of the gNBs 210, which may provide wireless communications access to the 5G CN 240 on behalf of the UE 105 using 5G NR. The wireless interface between base stations (gNBs 210 and/or ng-eNB 214) and the UE 105 may be referred to as a Uu interface 239. 5G NR radio access may also be referred to as NR radio access or as 5G radio access. In FIG. 2, serving gNB for UE 105 is assumed to be gNB 210-1, although other gNBs (e.g. gNB 210-2) may act as a serving gNB if UE 105 moves to another location or may act as a secondary gNB to provide additional throughput and bandwidth to UE 105.

Base stations in the NG-RAN 235 shown in FIG. 2 may also or instead include a next generation evolved Node B, also referred to as an ng-eNB, 214. Ng-eNB 214 may be connected to one or more gNBs 210 in NG-RAN 235—e.g., directly or indirectly via other gNBs 210 and/or other ng-eNBs. An ng-eNB 214 may provide LTE wireless access and/or evolved LTE (eLTE) wireless access to UE 105. Some gNBs 210 (e.g., gNB 210-2) and/or ng-eNB 214 in FIG. 2 may be configured to function as positioning-only beacons which may transmit signals (e.g., Positioning Reference Signal (PRS)) and/or may broadcast assistance data to assist positioning of UE 105 but may not receive signals from UE 105 or from other UEs. Some gNBs 210 (e.g., gNB 210-2 and/or another gNB not shown) and/or ng-eNB 214 may be configured to function as detecting-only nodes may scan for signals containing, e.g., PRS data, assistance data, or other location data. Such detecting-only nodes may not transmit signals or data to UEs but may transmit signals or data (relating to, e.g., PRS, assistance data, or other location data) to other network entities (e.g., one or more components of 5G CN 240, external client 230, or a controller) which may receive and store or use the data for positioning of at least UE 105. It is noted that while only one ng-eNB 214 is shown in FIG. 2, some embodiments may include multiple ng-eNBs 214. Base stations (e.g., gNBs 210 and/or ng-eNB 214) may communicate directly with one another via an Xn communication interface. Additionally, or alternatively, base stations may communicate directly or indirectly with other components of the 5G NR positioning system 200, such as the LMF 220 and AMF 215.

5G NR positioning system 200 may also include one or more WLANs 216 which may connect to a Non-3GPP InterWorking Function (N3IWF) 250 in the 5G CN 240 (e.g., in the case of an untrusted WLAN 216). For example, the WLAN 216 may support IEEE 802.11 Wi-Fi access for UE 105 and may comprise one or more Wi-Fi APs (e.g., APs 130 of FIG. 1). Here, the N3IWF 250 may connect to other elements in the 5G CN 240 such as AMF 215. In some embodiments, WLAN 216 may support another RAT such as Bluetooth. The N3IWF 250 may provide support for secure access by UE 105 to other elements in 5G CN 240 and/or may support interworking of one or more protocols used by WLAN 216 and UE 105 to one or more protocols used by other elements of 5G CN 240 such as AMF 215. For example, N3IWF 250 may support IPSec tunnel establishment with UE 105, termination of IKEv2/IPSec protocols with UE 105, termination of N2 and N3 interfaces to 5G CN 240 for control plane and user plane, respectively, relaying of uplink (UL) and downlink (DL) control plane Non-Access Stratum (NAS) signaling between UE 105 and AMF 215 across an N1 interface. In some other embodiments, WLAN 216 may connect directly to elements in 5G CN 240 (e.g. AMF 215 as shown by the dashed line in FIG. 2) and not via N3IWF 250. For example, direct connection of WLAN 216 to 5GCN 240 may occur if WLAN 216 is a trusted WLAN for 5GCN 240 and may be enabled using a Trusted WLAN Interworking Function (TWIF) (not shown in FIG. 2) which may be an element inside WLAN 216. It is noted that while only one WLAN 216 is shown in FIG. 2, some embodiments may include multiple WLANs 216.

Access nodes may comprise any of a variety of network entities enabling communication between the UE 105 and the AMF 215. As noted, this can include gNBs 210, ng-eNB 214, WLAN 216, and/or other types of cellular base stations. However, access nodes providing the functionality described herein may additionally or alternatively include entities enabling communications to any of a variety of RATs not illustrated in FIG. 2, which may include non-cellular technologies. Thus, the term "access node," as used in the embodiments described herein below, may include but is not necessarily limited to a gNB 210, ng-eNB 214 or WLAN 216.

In some embodiments, an access node, such as a gNB 210, ng-eNB 214, and/or WLAN 216 (alone or in combination with other components of the 5G NR positioning system 200), may be configured to, in response to receiving a request for location information from the LMF 220, obtain location measurements of uplink (UL) signals received from the UE 105) and/or obtain downlink (DL) location measurements from the UE 105 that were obtained by UE 105 for DL signals received by UE 105 from one or more access nodes. As noted, while FIG. 2 depicts access nodes (gNB 210, ng-eNB 214, and WLAN 216) configured to communicate according to 5G NR, LTE, and Wi-Fi communication protocols, respectively, access nodes configured to communicate according to other communication protocols may be used, such as, for example, a Node B using a Wideband Code Division Multiple Access (WCDMA) protocol for a Universal Mobile Telecommunications Service (UMTS) Terrestrial Radio Access Network (UTRAN), an eNB using an LTE protocol for an Evolved UTRAN (E-UTRAN), or a Bluetooth® beacon using a Bluetooth protocol for a WLAN. For example, in a 4G Evolved Packet System (EPS) providing LTE wireless access to UE 105, a RAN may comprise an E-UTRAN, which may comprise base stations comprising eNBs supporting LTE wireless access. A core network for EPS may comprise an Evolved Packet Core (EPC). An EPS may then comprise an E-UTRAN plus an EPC, where the E-UTRAN corresponds to NG-RAN 235 and the EPC corresponds to 5GCN 240 in FIG. 2. The methods and techniques described herein for obtaining a civic location for UE 105 may be applicable to such other networks.

The gNBs 210 and ng-eNB 214 can communicate with an AMF 215, which, for positioning functionality, communicates with an LMF 220. The AMF 215 may support mobility of the UE 105, including cell change and handover of UE 105 from an access node (e.g., gNB 210, ng-eNB 214, or WLAN 216) of a first RAT to an access node of a second RAT. The AMF 215 may also participate in supporting a signaling connection to the UE 105 and possibly data and voice bearers for the UE 105. The LMF 220 may support positioning of the UE 105 using a CP location solution when UE 105 accesses the NG-RAN 235 or WLAN 216 and may support position procedures and methods, including UE assisted/UE based and/or network based procedures/methods, such as Assisted GNSS (A-GNSS), Observed Time Difference Of Arrival (OTDOA) (which may be referred to in NR as Time Difference Of Arrival (TDOA)), Real Time Kinematic (RTK), Precise Point Positioning (PPP), Differential GNSS (DGNSS), Enhance Cell ID (ECID), angle of arrival (AoA), angle of departure (AoD), WLAN positioning, round trip signal propagation delay (RTT), multi-cell RTT, and/or other positioning procedures and methods. The LMF 220 may also process location service requests for the UE 105, e.g., received from the AMF 215 or from the GMLC 225. The LMF 220 may be connected to AMF 215 and/or to GMLC 225. In some embodiments, a network such as 5GCN 240 may additionally or alternatively implement other types of location-support modules, such as an Evolved Serving Mobile Location Center (E-SMLC) or a SUPL Location Platform (SLP). It is noted that in some embodiments, at least part of the positioning functionality (including determination of a UE 105's location) may be performed at the UE 105 (e.g., by measuring downlink PRS (DL-PRS) signals transmitted by wireless nodes such as gNBs 210, ng-eNB 214 and/or WLAN 216, and/or using assistance data provided to the UE 105, e.g., by LMF 220).

The Gateway Mobile Location Center (GMLC) 225 may support a location request for the UE 105 received from an external client 230 and may forward such a location request to the AMF 215 for forwarding by the AMF 215 to the LMF 220. A location response from the LMF 220 (e.g., containing a location estimate for the UE 105) may be similarly returned to the GMLC 225 either directly or via the AMF 215, and the GMLC 225 may then return the location response (e.g., containing the location estimate) to the external client 230.

A Network Exposure Function (NEF) 245 may be included in 5GCN 240. The NEF 245 may support secure exposure of capabilities and events concerning 5GCN 240 and UE 105 to the external client 230, which may then be referred to as an Access Function (AF) and may enable secure provision of information from external client 230 to 5GCN 240. NEF 245 may be connected to AMF 215 and/or to GMLC 225 for the purposes of obtaining a location (e.g., a civic location) of UE 105 and providing the location to external client 230.

As further illustrated in FIG. 2, the LMF 220 may communicate with the gNBs 210 and/or with the ng-eNB 214 using an NR Positioning Protocol annex (NRPPa) as defined in 3GPP Technical Specification (TS) 38.455. NRPPa messages may be transferred between a gNB 210 and the LMF 220, and/or between an ng-eNB 214 and the LMF 220, via the AMF 215. As further illustrated in FIG. 2, LMF 220 and UE 105 may communicate using an LTE Positioning Protocol (LPP) as defined in 3GPP TS 37.355. Here, LPP messages may be transferred between the UE 105 and the LMF 220 via the AMF 215 and a serving gNB 210-1 or serving ng-eNB 214 for UE 105. For example, LPP messages may be transferred between the LMF 220 and the AMF 215 using messages for service-based operations (e.g., based on the Hypertext Transfer Protocol (HTTP)) and may be transferred between the AMF 215 and the UE 105 using a 5G NAS protocol. The LPP protocol may be used to support positioning of UE 105 using UE assisted and/or UE based position methods such as A-GNSS, RTK, TDOA, multi-cell RTT, AoD, and/or ECID. The NRPPa protocol may be used to support positioning of UE 105 using network-based position methods such as ECID, AoA, uplink TDOA (UL-TDOA) and/or may be used by LMF 220 to obtain location related information from gNBs 210 and/or ng-eNB 214, such as parameters defining DL-PRS transmission from gNBs 210 and/or ng-eNB 214.

In the case of UE 105 access to WLAN 216, LMF 220 may use NRPPa and/or LPP to obtain a location of UE 105 in a similar manner to that just described for UE 105 access to a gNB 210 or ng-eNB 214. Thus, NRPPa messages may be transferred between a WLAN 216 and the LMF 220, via the AMF 215 and N3IWF 250 to support network-based positioning of UE 105 and/or transfer of other location information from WLAN 216 to LMF 220. Alternatively, NRPPa messages may be transferred between N3IWF 250 and the LMF 220, via the AMF 215, to support network-based positioning of UE 105 based on location related information and/or location measurements known to or accessible to N3IWF 250 and transferred from N3IWF 250 to LMF 220 using NRPPa. Similarly, LPP and/or LPP messages may be transferred between the UE 105 and the LMF 220 via the AMF 215, N3IWF 250, and serving WLAN 216 for UE 105 to support UE assisted or UE based positioning of UE 105 by LMF 220.

In a 5G NR positioning system 200, positioning methods can be categorized as being "UE assisted" or "UE based." This may depend on where the request for determining the position of the UE 105 originated. If, for example, the request originated at the UE (e.g., from an application, or "app," executed by the UE), the positioning method may be categorized as being UE based. If, on the other hand, the request originates from an external client or AF 230, LMF 220, or other device or service within the 5G network, the positioning method may be categorized as being UE assisted (or "network-based").

With a UE-assisted position method, UE 105 may obtain location measurements and send the measurements to a location server (e.g., LMF 220) for computation of a location estimate for UE 105. For RAT-dependent position methods location measurements may include one or more of a Received Signal Strength Indicator (RSSI), Round Trip signal propagation Time (RTT), Reference Signal Received Power (RSRP), Reference Signal Received Quality (RSRQ), Reference Signal Time Difference (RSTD), Time of Arrival (TOA), AoA, Receive Time-Transmission Time Difference (Rx-Tx), Differential AoA (DAoA), AoD, or Timing Advance (TA) for gNBs 210, ng-eNB 214, and/or one or more access points for WLAN 216. Additionally or alternatively, similar measurements may be made of sidelink signals transmitted by other UEs, which may serve as anchor points for positioning of the UE 105 if the positions of the other UEs are known. The location measurements may also or instead include measurements for RAT-independent positioning methods such as GNSS (e.g., GNSS pseudorange, GNSS code phase, and/or GNSS carrier phase for GNSS satellites 110), WLAN, etc.

With a UE-based position method, UE 105 may obtain location measurements (e.g., which may be the same as or similar to location measurements for a UE assisted position method) and may further compute a location of UE 105 (e.g., with the help of assistance data received from a location server such as LMF 220, an SLP, or broadcast by gNBs 210, ng-eNB 214, or WLAN 216).

With a network based position method, one or more base stations (e.g., gNBs 210 and/or ng-eNB 214), one or more APs (e.g., in WLAN 216), or N3IWF 250 may obtain location measurements (e.g., measurements of RSSI, RTT, RSRP, RSRQ, AoA, or TOA) for signals transmitted by UE 105, and/or may receive measurements obtained by UE 105 or by an AP in WLAN 216 in the case of N3IWF 250, and may send the measurements to a location server (e.g., LMF 220) for computation of a location estimate for UE 105.

Positioning of the UE 105 also may be categorized as UL, DL, or DL-UL based, depending on the types of signals used for positioning. If, for example, positioning is based solely on signals received at the UE 105 (e.g., from a base station or other UE), the positioning may be categorized as DL based. On the other hand, if positioning is based solely on signals transmitted by the UE 105 (which may be received by a base station or other UE, for example), the positioning may be categorized as UL based. Positioning that is DL-UL based includes positioning, such as RTT-based positioning, that is based on signals that are both transmitted and received by the UE 105. Sidelink (SL)-assisted positioning comprises signals communicated between the UE 105 and one or more other UEs. According to some embodiments, UL, DL, or DL-UL positioning as described herein may be capable of using SL signaling as a complement or replacement of SL, DL, or DL-UL signaling.

Depending on the type of positioning (e.g., UL, DL, or DL-UL based) the types of reference signals used can vary. For DL-based positioning, for example, these signals may comprise PRS (e.g., DL-PRS transmitted by base stations or SL-PRS transmitted by other UEs), which can be used for TDOA, AoD, and RTT measurements. Other reference signals that can be used for positioning (UL, DL, or DL-UL) may include Sounding Reference Signal (SRS), Channel State Information Reference Signal (CSI-RS), synchronization signals (e.g., synchronization signal block (SSB) Synchronizations Signal (SS)), Physical Uplink Control Channel (PUCCH), Physical Uplink Shared Channel (PUSCH), Physical Sidelink Shared Channel (PSSCH), Demodulation Reference Signal (DMRS), etc. Moreover, reference signals may be transmitted in a Tx beam and/or received in an Rx beam (e.g., using beamforming techniques), which may impact angular measurements, such as AoD and/or AoA.

As previously noted, the estimated location of a target UE (e.g., UE 105) may be based on measurements of RF signals sent from and/or received by the target UE (e.g., DL-UL based and/or DL-based positioning). For example, when performing RTT based positioning, the RTT may be determined based on a total delay of the signal transmitted between base stations (e.g., gNBs 210 and/or ng-eNB 214) and the target UE. For example, the total delay may be determined based on performing a cross-correlation between the signal transmitted from a base station and the signal received by the target UE. The peak of the cross-correlation may be used to determine the total delay. Specifically, FIG. 3 illustrates an example sampled cross-correlation R[m] between a sampled signal x(k) sampled based on a signal x(t) (e.g., t=kT, where the sampling rate Fs=1/T) which is transmitted by a base station and a sampled signal y(k) sampled based on a signal y(t) (e.g., t=kT, where the sampling rate Fs=1/T) which is received by the target UE.

Figure 3:
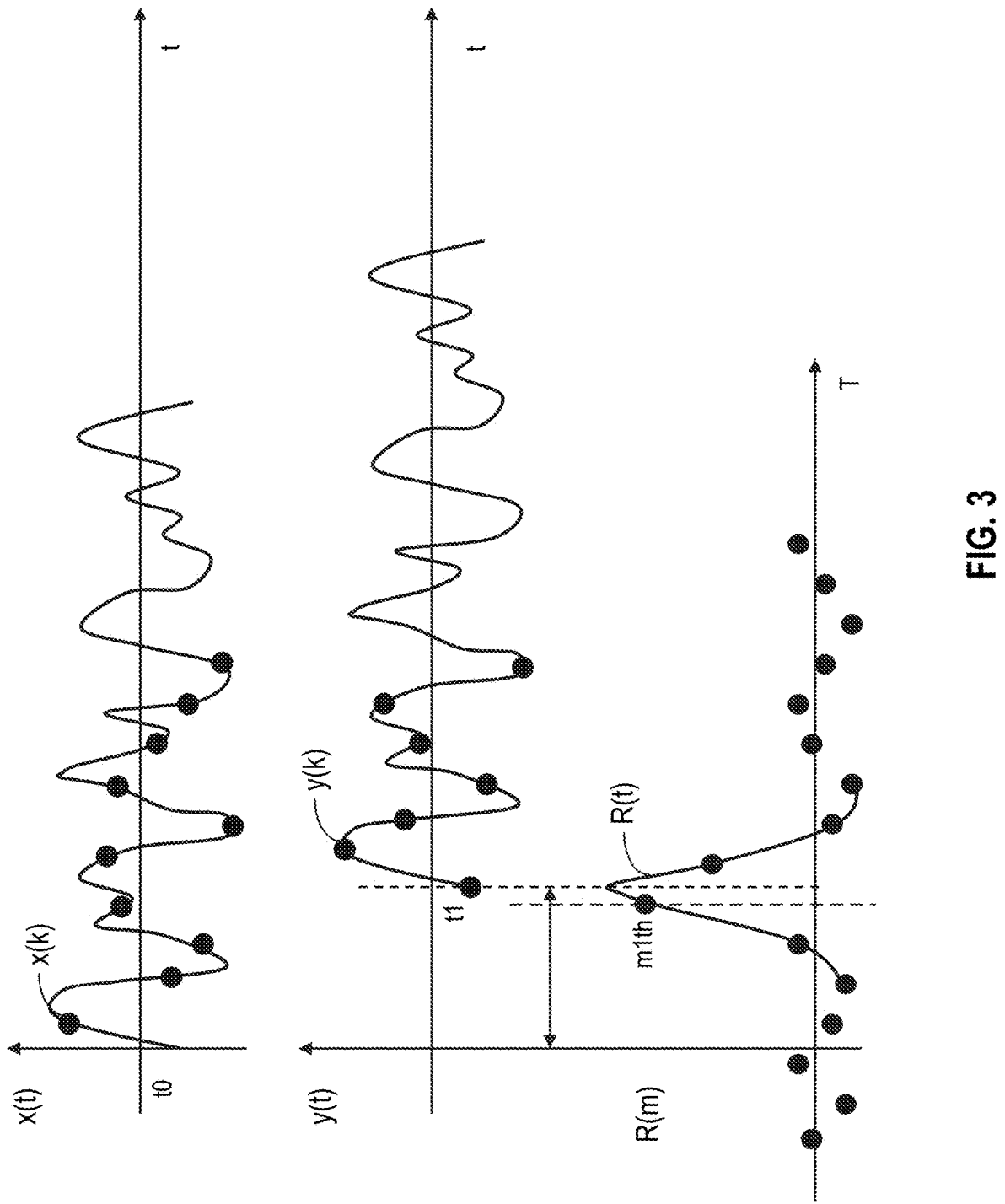
FIG. 3 illustrates an example sampled cross-correlation between a waveform transmitted by a base station and a waveform received by a UE.

As illustrated in FIG. 3, at time point t0, an analog signal x(t) is transmitted from the base station (e.g., a gNB). At time point t1, the analog signal y(t) is received by the target UE. In some embodiments, the received signal y (t) can be determined according to equation (1):

$$y(t) = Ge^{j\varphi}x(t - \Delta\tau) + n(t) \tag{1}$$

where G denotes the gain (e.g., adjusted by a gain control module), p denotes the phase shift, $\Delta\tau$ denotes the total delay between x(t) and y(t) (e.g., $\Delta\tau$=t1−t0), and n(t) denotes the noise introduced during the process. Upon receipt, the target UE preprocesses the analog signal (e.g., sampling, filtering, and/or adjusting gains) and the received signal y(t) is converted to a digital signal (e.g., a discrete signal) y[k] at a sampling rate of Fs (e.g., y[k]=y(t=kT), where the sampling rate Fs=1/T) by an ADC. By determining a sampled cross-correlation R[m] between the sampled signal y[k] and the sampled reference signal x[k] sampled based on x[t] at the sampling frequency of Fs (e.g., x[k]=x(t=kT), R[m]=<y [k+m], x[k]>), the total delay $\Delta\tau$ can be determined accordingly.

For example, as illustrated in FIG. 3, the m₁th (e.g., start counting from t0) sample of R[m] may correspond to the peak in the plot of R [m] and $m_1T$ may be interpreted as the total delay $\Delta\tau$ between x(t) and y(t) (e.g., $m_1T \approx \Delta\tau$) accordingly. It is understood that because both x[k] and y[k] are discrete signals (e.g., sampled at a the sampling rate Fs), the peak of the plot of R [t] (e.g., the cross-correlation between x(t) and y(t), R [t]=<y[t+$\Delta\tau$], x[t]>) may not necessarily coincide at an integer sample offset in R[m], namely, $m_1T$ may not exactly equal to AT (e.g., offset by a difference between the two dashed vertical lines t').

Figure 4A:
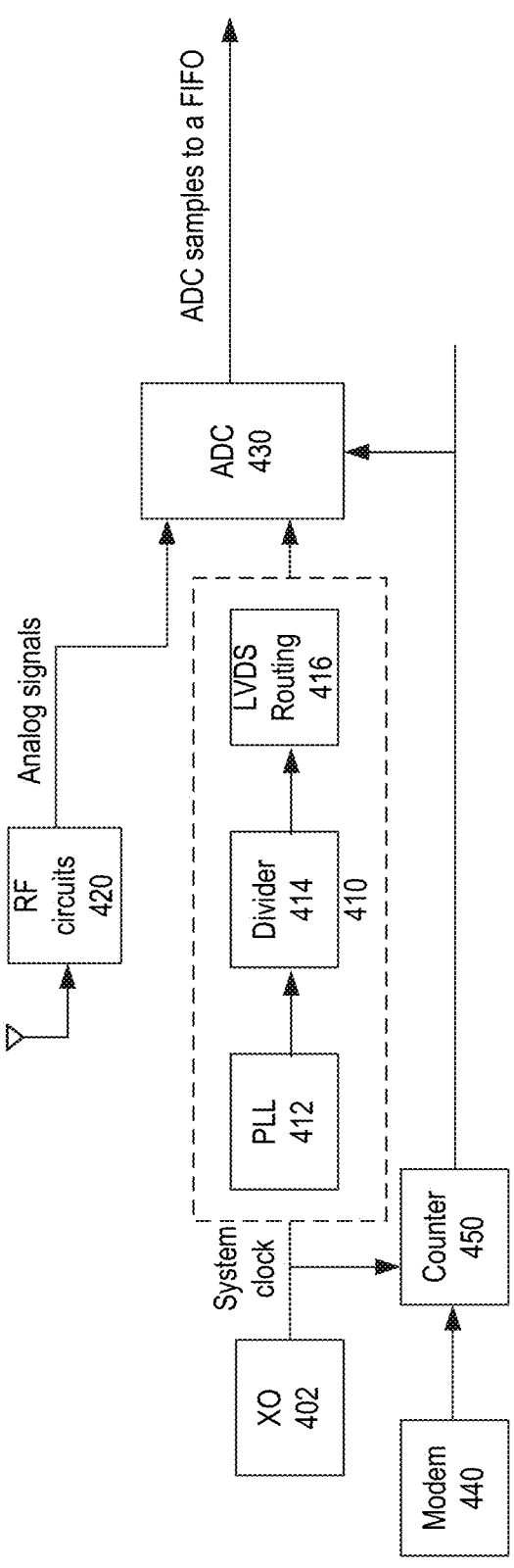
FIGS. 4A and 4B illustrate an existing ADC sampling system and the corresponding timing diagrams of the clock signals.

As previously noted, an accurate calculation of the measurements determined based on the RF signal, may be based on a precise knowledge of the ADC output timing (e.g., the timing of the sets of ADC samples). Existing ADC sampling systems have uncertainties in determining the ADC output timing due to accumulated delay in the long ADC output clock generation path. For example, FIG. 4A is a diagram illustrating an existing ADC sampling system 400. As illustrated in FIG. 4A, in some embodiments, ADC sampling system 400 includes an oscillator (XO) 402 configured to generate a system clock (e.g., a reference clock at 38.4 MHz), an ADC input clock generation module 410 configured to generate an ADC input clock based on the system clock, a RF circuits 420, and an ADC 430 configured to convert the received analog signals (e.g., received from an input terminal of ADC 430) to digital signals (e.g., sampling). In some embodiments, RF circuits 420 may include a transceiver configured to receive the analog signals.

In some embodiments, ADC input clock generation module 410 may generate the ADC input clock by adjusting the rate of the system clock. Specifically, ADC input clock generation module 410 may include a phase-locked loop (PLL) 412 configured to multiply the rate of the system clock by a first predetermined value (e.g., generate an output frequency at multiples of an input frequency), a clock divider 414 configured to divide the rate of the multiplied system clock by a second predetermined value (e.g., generate an output frequency at fractions of an input frequency), and a low voltage differential signaling (LVDS) 416 configured to route the adjusted system clock to ADC 430. For example, the first value may be set as 3 (e.g., multiply the rate of the system clock by 3), and the second value may be set as 2 (e.g., divided the rate of the multiplied system clock by 2). The generated ADC input clock may be input to ADC 430 (e.g., input to a clock terminal of ADC 430) along with the analog signal received from RF circuits (e.g., input from input terminal of ADC 430). ADC 430 may output a set of ADC samples generated based on sampling the signal input from the input terminal (e.g., the analog signal received by the transceiver) according to the ADC input clock and may output an ADC output clock accordingly. The ADC output clock may include certain delays to the ADC input clock due to the circuitry of ADC 430.

In some embodiments, ADC sampling system 400 may further include a modem 440 (e.g., a processor) configured to manage ADC sampling system 400. For example, modem 440 may be configured to generate a start signal indicating a starting point of capturing the set of ADC samples generated by ADC 430. ADC sampling system 400 may also include a counter 450. Specifically, modem 440 may start ADC 430 at a pre-determined time point, which is set by pre-programming a value. At the pre-determined time point, counter 450 will trigger and provide to the ADC an "enable" signal, synchronized to the system clock from XO 402, for starting ADC 430. In some embodiments, ADC sampling system 400 may also include a first in first out (FIFO) memory/buffer (not shown) configured to store/capture the set of ADC samples based on the capturing sample clock. For example, ADC sampling system 400 may further include an AND gate (not shown) configured to combine the ADC output clock with the resynchronized start signal to generate the capturing sample clock for the FIFO memory/buffer to store/capture the set of ADC samples.

Figure 4B:
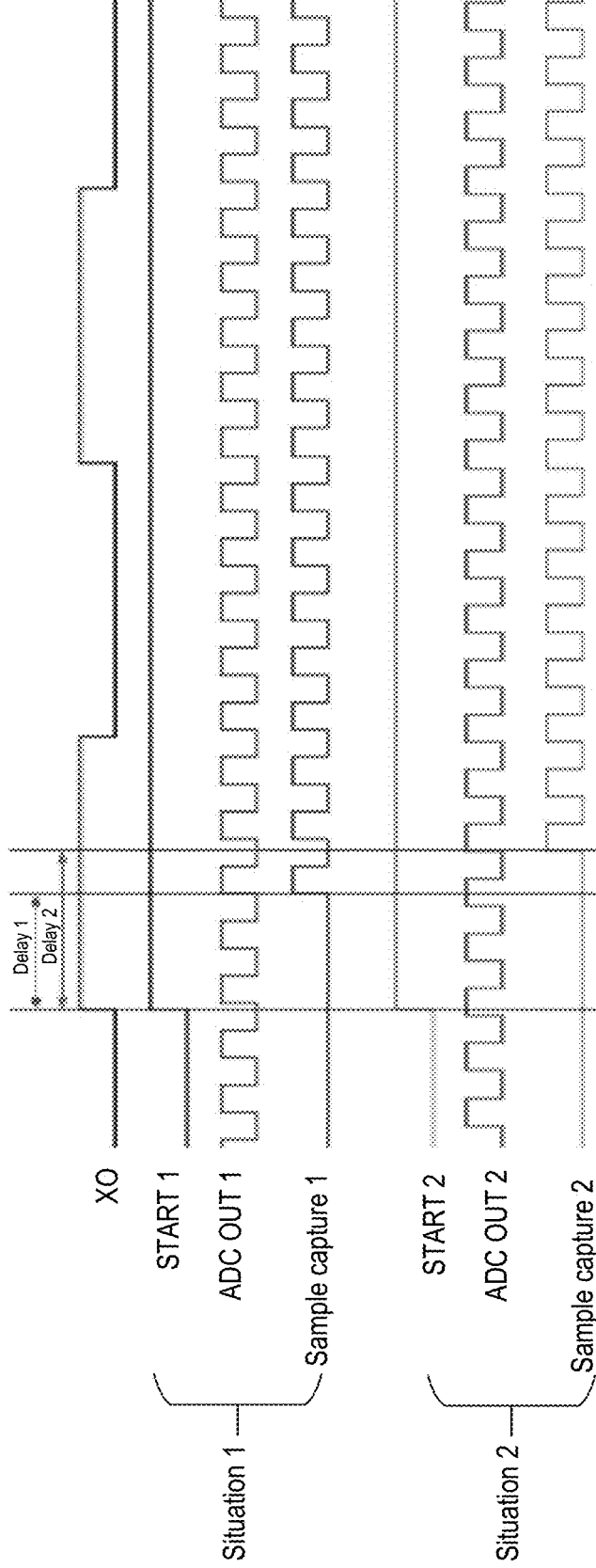

Because of the long generation chain for generating the ADC output clock, the timing and/or delay of the output of ADC 430 (e.g., the set of ADC samples) is uncertain. Specifically, the delay in clock signals caused by the circuits (e.g., PLL 412, clock divider 414, and LVDS 416 in ADC input clock generation module 410, and ADC 430) varies with the temperature and the process corner of the circuits. For example, FIG. 4B illustrates timing diagrams for each of the clock signals in ADC sampling system 400 in different situations. Specifically, FIG. 4B shows the examples of delays in both a high temperature situation, situation 1 (e.g., START 1, ADC OUT 1, and Sample capture 1), and a low temperature situation, situation 2 (e.g., START 2, ADC OUT 2, and Sample capture 2). As illustrated in FIG. 4B, XO 402 may generate the system clock at a predetermined rate (e.g., at 38.4 MHz) and the system clock may be used as a reference clock. When it is decided (e.g., by modem 440) in order to perform an RTT or similar measurement, to capture samples in the set of ADC samples (e.g., store the samples in the FIFO memory/buffer), a register of modem 440 may generate start signals (e.g., START 1 and/or START 2) indicating a starting point of the FIFO memory/buffer capturing the set of ADC samples. The initiation of the start signal is programmed to happen at a pre-determined time point by setting the value at which the counter will trigger it. For example, the pre-determined time point may be set by pre-programming a value at which counter 450 will trigger and provide to the ADC an "enable" signal, synchronized to the system clock from XO 402, for starting ADC 430. After processing by ADC input clock generation module 410 (e.g., by the PLL, the clock divider, and the LVDS) and ADC 430, the ADC output clock (e.g., ADC OUT 1 and ADC OUT 2) may have uncertain delay in timing with respect to the system clock.

For example, as illustrated in FIG. 4B, because of the temperature and process corner differences in situations 1 and 2, the rising edge of ADC OUT 1 in situation 1 is slightly (e.g., less than a cycle) behind the rising edge of the system clock (e.g., with a slow/hot process corner) and the rising edge of ADC OUT 2 in situation 2 is slightly (e.g., less than a cycle) ahead of the rising edge of the system clock (e.g., with a fast/cold process corner). Because the sample capture clock (e.g., Sample capture 1 and Sample capture 2) is generated along a path containing uncertain variations (e.g., delays caused by the processing circuits such as PLL 412, clock divider 414, LVDS 416, and ADC 430), the ADC output clock may have up to a 2-cycle timing difference in the sample capture clocks (e.g., Sample capture 1 and Sample capture 2) for the FIFO memory/buffer to capture/store the corresponding set of output samples of ADC 430.

It is contemplated that some of the components in ADC sampling system 400 described herein may be optional and ADC sampling system 400 may also include other suitable hardware and/or software components without deviate from the spirit of the technology. For ease of illustration, the technical details of the components disclosed herein will not be further described and will not affect the functioning of the technology disclosed herein. A person skilled in the art to which the disclosure pertains can figure out how those components work without undue experiments.

Figure 5:
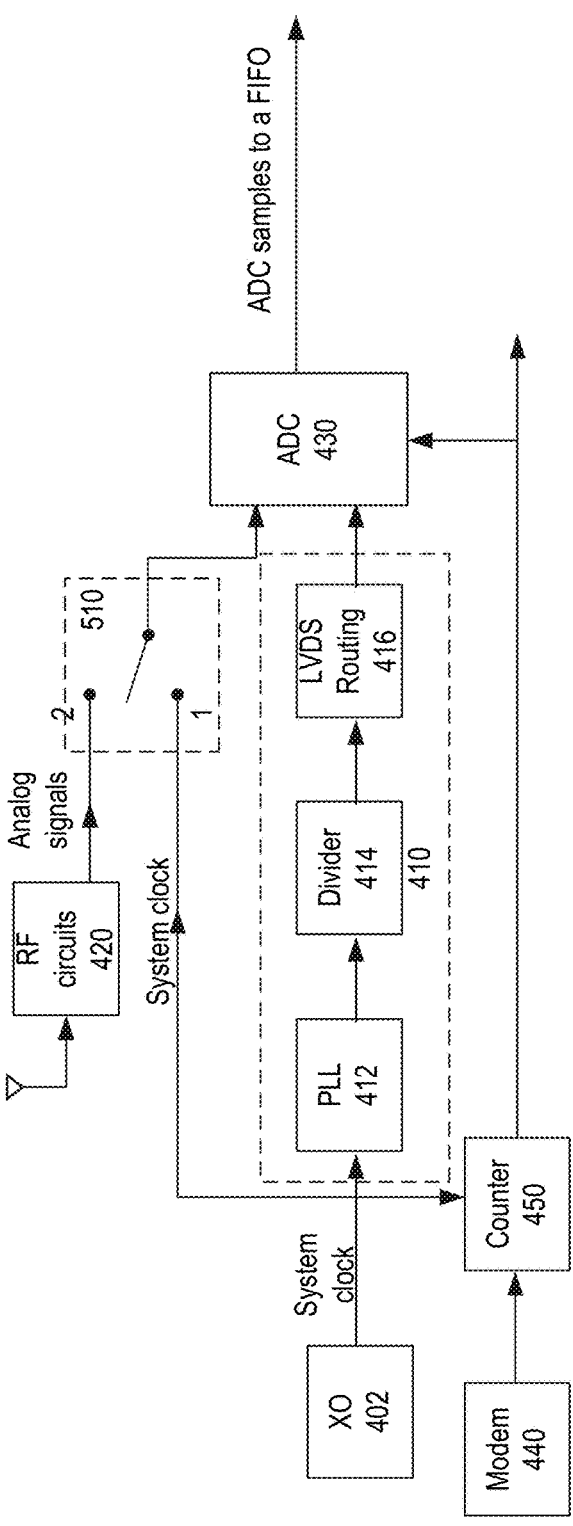
FIG. 5 is a diagram illustrating an example ADC sampling system according to an embodiment.

FIG. 5 is a diagram illustrating an example ADC sampling system 500 according to an embodiment. ADC sampling system 500 is similar to ADC sampling system 400, except ADC sampling system 500 includes a switch 510 in addition to the components in ADC sampling system 400, configured to control the working mode of ADC sampling system 500. FIG. 6 illustrates a flowchart of an exemplary method 600 for determining ADC output timing in ADC sampling system 500, according to an embodiment. Means for performing the functionality illustrated in one or more of the blocks shown in FIG. 6 may be performed by hardware and/or software components of a target UE including ADC sampling system 500. Example components of the target UE are illustrated in FIG. 5. It is to be appreciated that some of the functionalities illustrated in one or more of the blocks shown in FIG. 6 may be optional to perform the disclosure provided herein. Further, some of the functionalities illustrated in one or more of the blocks shown in FIG. 6 may be performed simultaneously, or in a different order than shown in FIG. 6. FIG. 5 and FIG. 6 will be described together.

As shown in FIG. 5, switch 510 may operate in a first mode (e.g., connecting to position 1) or a second mode (e.g., connecting to position 2). In some embodiments, the operation of switch 510 may be controlled by a processor (e.g., modem 440). For example, modem 440 may determine the operation mode (e.g., the first mode or the second mode) of switch 510. When working in the first mode, the system clock generated by oscillator 402 may be directly routed to the input terminal of ADC 430 for sampling. Accordingly, ADC sampling system 500 may correspondingly work in an ADC output timing determination mode. When working in the second mode, the analog signals received from RF circuits 420 (e.g., received by the transceiver of RF circuits 420) may be directly routed to the input terminal of ADC 430 for sampling. Accordingly, ADC sampling system 500 may correspondingly work in a regular working mode (e.g., processing the signal received and/or transmitted).

Figure 9:
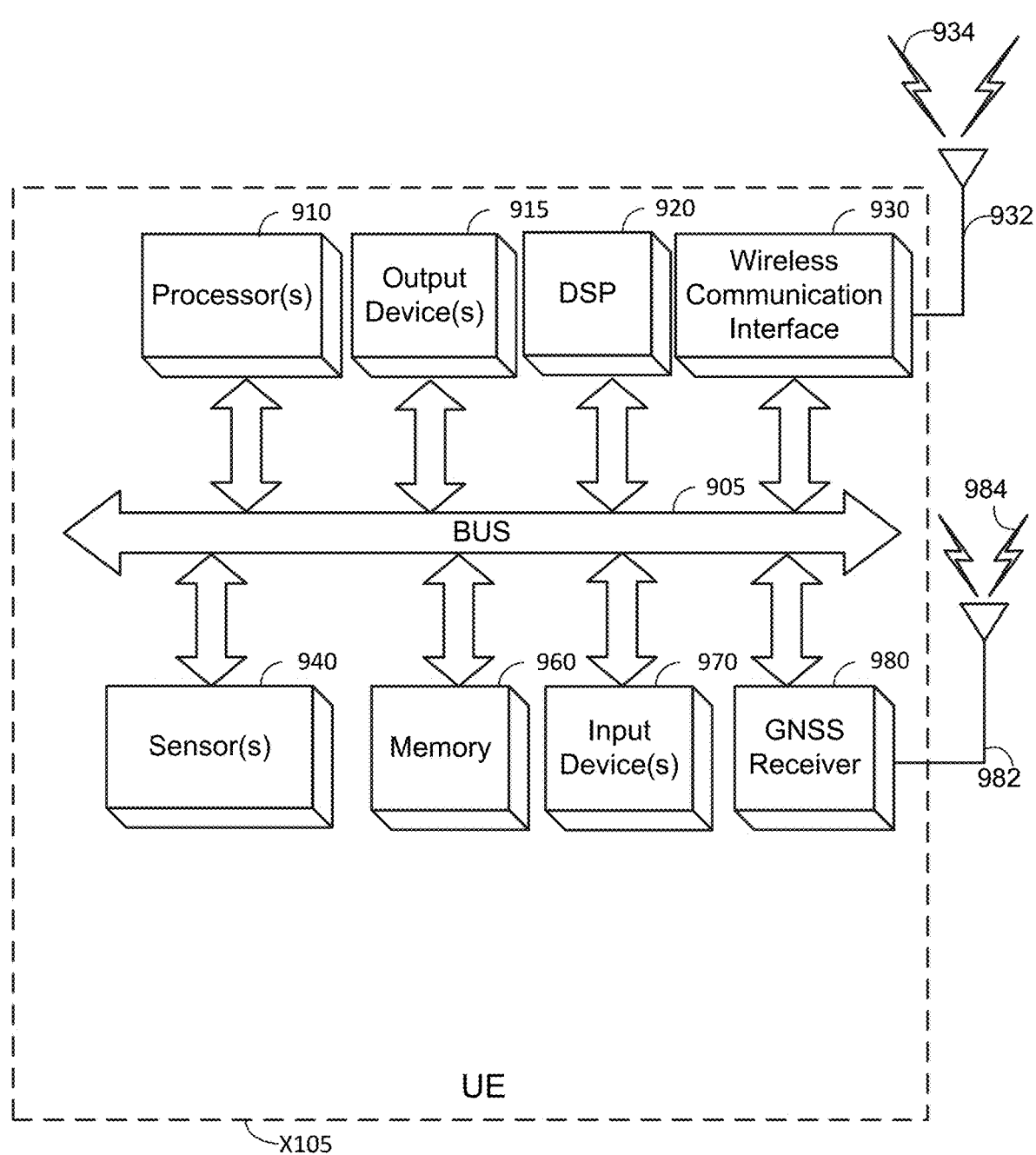
FIG. 9 is a block diagram of an embodiment of a UE, which can be utilized in embodiments as described herein.

For example, at block 610, the functionality comprises operating switch 510 in the first mode (e.g., switch 510 switches to position 1) to route the system clock from oscillator 402 to the input terminal of ADC 430. Means for performing functionality at block 610 may comprise modem 440, and/or other components of the target UE (e.g., UE 105), as illustrated in FIG. 9. ADC 430 may sample the system clock based on the input ADC clock generated by ADC input clock generation module 410 to generate a first set of ADC samples. Accordingly, the first set of ADC samples may include information regarding both the system clock and the ADC input clock. Specifically, ADC input clock generation module 410 may include PLL 412 configured to multiply the rate of the system clock by a first predetermined value (e.g., generate an output frequency at multiples of an input frequency), clock divider 414 configured to divide the rate of the multiplied system clock by a second predetermined value (e.g., generate an output frequency at fractions of an input frequency), and LVDS 416 configured to route the adjusted system clock to ADC 430. For example, the first value may be set as 3 (e.g., multiply the rate of the system clock by 3), and the second value may be set as 2 (e.g., divided the rate of the multiplied system clock by 2). The generated ADC input clock may be input to ADC 430 (e.g., input to a clock terminal of ADC 430) along with the system clock (e.g., input at the input terminal of ADC 430). The system clock may be sampled based on the ADC input clock to generate the first set of ADC samples accordingly.

At block 620, the functionality comprises determining a first ADC output timing based on the first set of ADC samples generated by ADC 430. Means for performing functionality at block 620 may comprise modem 440 and/or other components of the target UE (e.g., UE 105), as illustrated in FIG. 9. For example, modem 440 may scan for rising edges of the system clock in the first set of ADC samples. Accordingly, output timing of ADC 430 (e.g., the exact timing of the ADC samples can be determined) may be determined.

At block 630, the functionality comprises operating switch 510 in a second mode (e.g., switch 510 switches to position 2) to route analog signals received from RF circuit 420 (e.g., received by a transceiver) to the input terminal of ADC 430. Means for performing functionality at block 630 may comprise modem 440 and/or other components of the target UE (e.g., UE 105), as illustrated in FIG. 9.

At block 640, the functionality comprises sampling the analog signals received from RF circuit 420 based on the input ADC clock generated by ADC input clock generation module 410 to generate/obtain a second set of ADC output samples. Means for performing functionality at block 640 may comprise ADC 430 and/or other components of the target UE (e.g., UE 105), as illustrated in FIG. 9.

At block 650, the functionality comprises determining the output timing of the second set of ADC samples based at least in part on the determined first ADC output timing. Means for performing functionality at block 650 may comprise modem 440 and/or other components of the target UE (e.g., UE 105), as illustrated in FIG. 9. For example, because both the first set of ADC samples and the second set of ADC samples are sampled at the same sampling rate (e.g., according to the ADC input clock), the output timing of the second set of ADC samples may be determined as the same as the determined first ADC output timing (e.g., the output timing of the first set of ADC samples).

Because the system clock is directly routed to the input terminal of ADC 430 when generating the first set of ADC samples, the output timing of the first set of ADC samples determined based on using the system clock as the reference can be obtained with no uncertainty. Accordingly, the output timing of ADC 430 when functioning in the regular working mode (e.g., the output timing of the second set of ADC samples generated based on the analog signal received from the transceiver when switch 510 is in position 2) can be determined accurately based on the output timing of the first set of ADC samples.

Figure 7A:
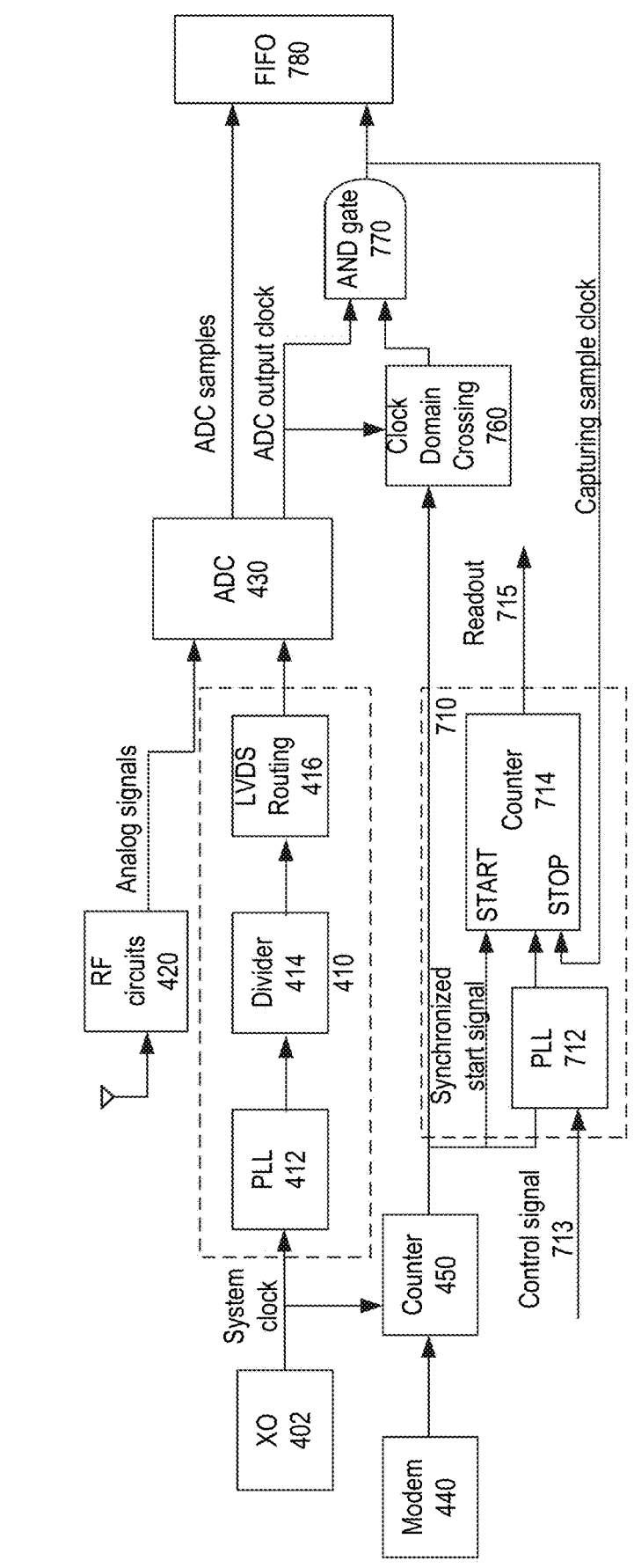
FIGS. 7A and 7B illustrate another example ADC sampling system and the corresponding timing diagrams for the clock signals according to an embodiment.
Figure 7B:
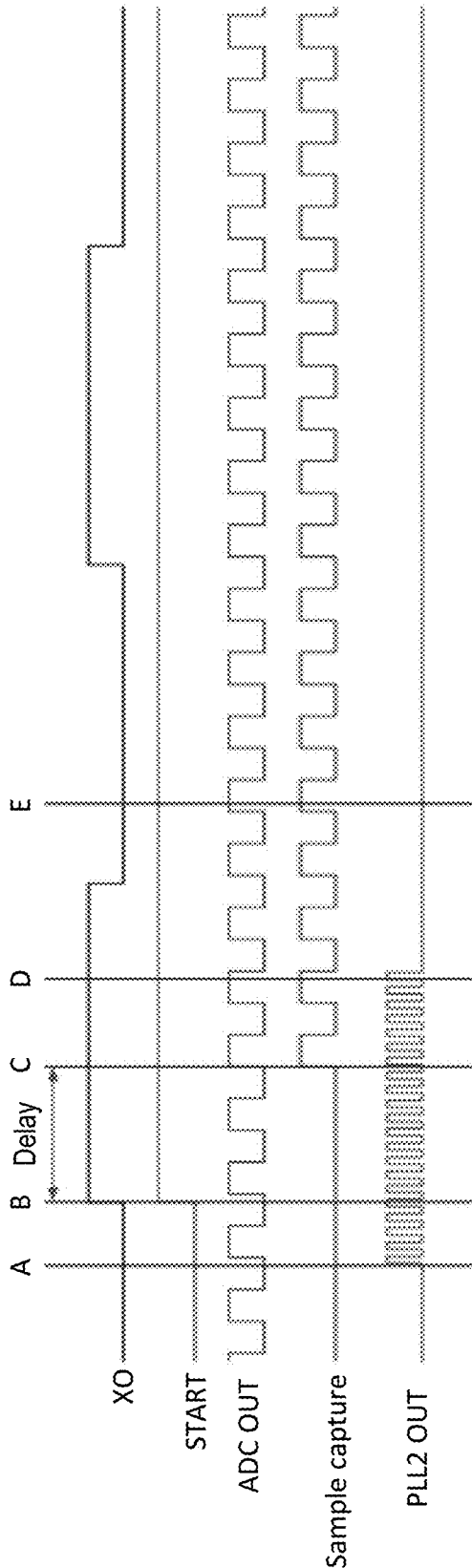
Figure 8:
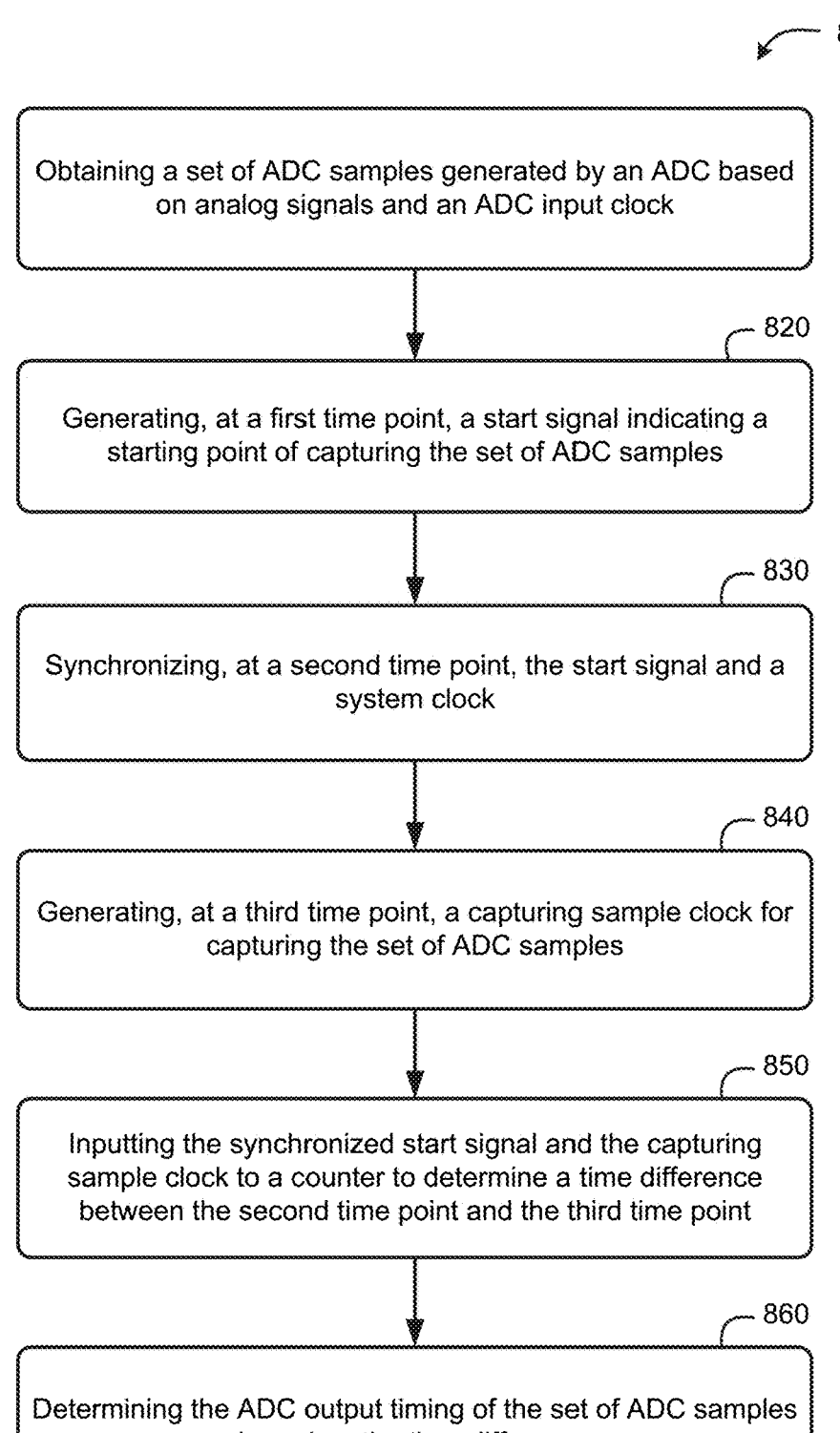
FIG. 8 is a flow chart of determining an ADC output timing in a UE, according to an embodiment.

FIG. 7A is a diagram illustrating another example ADC sampling system 700 and FIG. 7B illustrates timing diagrams for clock signals in ADC sampling system 700 according to an embodiment. ADC sampling system 700 is similar to ADC sampling system 400, except ADC sampling system 700 includes an ADC output timing determination module 710 in addition to the components in ADC sampling system 400, configured to determine the ADC output timing in ADC sampling system 700. FIG. 8 illustrates a flowchart of an exemplary method 800 for determining ADC output timing in ADC sampling system 700, according to an embodiment. Means for performing the functionality illustrated in one or more of the blocks shown in FIG. 8 may be performed by hardware and/or software components of a target UE including ADC sampling system 700. Example components of the target UE are illustrated in FIG. 7A. It is to be appreciated that some of the functionalities illustrated in one or more of the blocks shown in FIG. 8 may be optional to perform the disclosure provided herein. Further, some of the functionalities illustrated in one or more of the blocks shown in FIG. 8 may be performed simultaneously, or in a different order than shown in FIG. 8. FIGS. 7A and 7B, and FIG. 8 will be described together.

As shown in FIG. 7A, ADC sampling system 700 may include an ADC output timing determination module 710 configured to obtain an ADC output timing, a clock domain crossing (CDC) 760 configured to resynchronize the synchronized start signal with the ADC output clock, an AND gate 770 configured to generate a capturing sample clock for capturing the set of ADC samples generated by ADC 430, and a first in first out (FIFO) memory/buffer 780 configured to store/capture the set of ADC samples based on the capturing sample clock. For example, AND gate 770 may combine the ADC output clock with the resynchronized start signal to generate the capturing sample clock for FIFO memory/buffer 780 to store/capture the set of ADC samples.

In some embodiments, ADC output timing determination module 710 may include a phase lock loop (PLL) 712 and a counter 714. PLL 712 may be configured to generate a high frequency clock (e.g., the PLL output clock may be used as a counter clock for counter 714) based on the system clock (e.g., multiply the rate of the system clock by a third value, such as 5, 10, 15, 20, etc.). Counter 714 may be configured to calculate the ADC output timing based on the high frequency clock. In some embodiments, counter 714 may include a first input terminal (a START terminal) and a second input terminal (e.g., a STOP terminal) configured to receive the start signal synchronized by counter 450 (e.g., synchronize the start signal with the system clock with a predetermined time-delay) and the capturing sample clock (e.g., generated by AND gate 770) respectively. Counter 714 may count the time difference between receiving the synchronized start signal (e.g., indicating the time point for capturing ADC samples determined/intended by modem 440, shown as time point B in FIG. 7B) and receiving the capturing sample clock (e.g., the time point when ADC samples are actually captured, shown as time point C in FIG. 7B). In some embodiments, PLL 712 may be controlled by receiving a control signal 713 (e.g., an Enable signal) from modem firmware/software (e.g., from modem 440). For example, PLL 712 may be controlled (e.g., by modem 440) to start generating the PLL output clock for counter 714 which may be used as the counter clock at a time point few cycles before counter 714 actually start to count the time difference between time point B and time point C (e.g., start at time point A to generate the PLL output clock). PLL 712 may also be controlled (e.g., by modem 440) to stop generating the PLL output clock (e.g., turned off) few cycles after counter 714 stopped counting the time difference between time point B and time point C (e.g., turned off at time point D shown in FIG. 7B). At some time point after counter 714 stopped counting the time difference between time point B and time point C (e.g., at time point E shown in FIG. 7B), readout 715 of counter 714 indicating the time difference may be output to a modem software (e.g., modem 440) for calculating of the ADC output timing. Accordingly, the ADC output timing (e.g., the timing of ADC samples) can be obtained accurately.

Specifically, at block 810, the functionality comprises obtaining a set of ADC samples generated by ADC 430 based on analog signals received from RF circuits and an ADC input clock. Means for performing functionality at block 810 may comprise ADC input clock generation module 410, RF circuits 420, and/or other components of the target UE (e.g., UE 105), as illustrated in FIG. 9.

At block 820, the functionality comprises generating, at a first time point, a start signal indicating a starting point of capturing the set of ADC samples. Means for performing functionality at block 820 may comprise modem 440 and/or other components of the target UE (e.g., UE 105), as illustrated in FIG. 9.

At block 830, the functionality comprises synchronizing, at a second time point (e.g., at time point B shown in FIG. 7B), the start signal and a system clock. Means for performing functionality at block 820 may comprise modem 440, counter 450 and/or other components of the target UE (e.g., UE 105), as illustrated in FIG. 9.

At block 840, the functionality comprises generating, at a third time point (e.g., at time point C shown in FIG. 7B), a capturing sample clock for capturing the set of ADC sample. Means for performing functionality at block 840 may comprise modem 440 and/or other components of the target UE (e.g., UE 105), as illustrated in FIG. 9. The capturing sample clock indicates the actual start time of ADC sample capturing. The process for the generation of the capturing sample clock is similar to the capturing sample clock generation in ADC sampling systems 400 and 500, and for ease of illustration, the process will not be repeated.

At block 850, the functionality comprises inputting the synchronized start signal and the capturing sample clock to counter 714 to determine a time difference between the second time point and the third time point. Means for performing functionality at block 850 may comprise ADC 430 and/or other components of the target UE (e.g., UE 105), as illustrated in FIG. 9. The synchronized start signal and the capturing sample clock may be fed to a start terminal and a stop terminal to trigger the start of counting and the stop of counting in counter 714 respectively. Specifically, counter 714 starts to count when the synchronized start signal is fed to the first input terminal of counter 714 at time point B as shown in FIG. 7B. The synchronized start signal indicates the intended start time of ADC sample capturing by the FIFO memory/buffer. Counter 714 stops to count when the capturing sample clock is fed to the second input terminal of counter 714 at time point C as shown in FIG. 7B. The capturing sample clock indicates the actual start time of ADC sample capturing by the FIFO memory/buffer.

At block 860, the functionality comprises determining the ADC output timing of the set of ADC samples based on the time difference. Means for performing functionality at block 860 may comprise modem 440 and/or other components of the target UE (e.g., UE 105), as illustrated in FIG. 9. Specifically, the time difference between the intended ADC sample capture time and the actual ADC sample capture time can be used for determining the ADC output timing (e.g., the delay) of the set of ADC samples.

Because the synchronized start signal includes the information of the system clock (e.g., is synchronized with the system clock), and is directly routed to the input terminal of the PLL 712 along with the capturing sample clock for determining the output timing of ADC 430, the output timing of ADC 430 can be determined preciously as a result. For example, modem 440 and/or other components of the target UE (e.g., UE 105), as illustrated in FIG. 9 may receive the output of counter 714 (e.g., the readout) and determine the output timing of ADC 430 accordingly.

FIG. 9 is a block diagram of an embodiment of a UE 105, which can be utilized as described herein above (e.g., in association with FIGS. 4A, 5, and 7A). For example, the UE 105 can perform one or more of the functions of the method shown in FIGS. 6 and 8. It should be noted that FIG. 9 is meant only to provide a generalized illustration of various components, any or all of which may be utilized as appropriate. It can be noted that, in some instances, components illustrated by FIG. 9 can be localized to a single physical device and/or distributed among various networked devices, which may be disposed at different physical locations. Furthermore, as previously noted, the functionality of the UE discussed in the previously described embodiments may be executed by one or more of the hardware and/or software components illustrated in FIG. 9.

The UE 105 is shown comprising hardware elements that can be electrically coupled via a bus 905 (or may otherwise be in communication, as appropriate). The hardware elements may include a processor(s) 910 which can include without limitation one or more general-purpose processors (e.g., an application processor), one or more special-purpose processors (such as digital signal processor (DSP) chips, graphics acceleration processors, application specific integrated circuits (ASICs), and/or the like), and/or other processing structures or means. Processor(s) 910 may comprise one or more processing units, which may be housed in a single integrated circuit (IC) or multiple ICs. As shown in FIG. 9, some embodiments may have a separate DSP 920, depending on desired functionality. Location determination and/or other determinations based on wireless communication may be provided in the processor(s) 910 and/or wireless communication interface 930 (discussed below). The UE 105 also can include one or more input devices 970, which can include without limitation one or more keyboards, touch screens, touch pads, microphones, buttons, dials, switches, and/or the like; and one or more output devices 915, which can include without limitation one or more displays (e.g., touch screens), light emitting diodes (LEDs), speakers, and/or the like.

The UE 105, modem 440, and other circuitry in FIGS. 4A, 5, and 7A may also include a wireless communication interface 930, which may comprise without limitation a modem, a network card, an infrared communication device, a wireless communication device, and/or a chipset (such as a Bluetooth® device, an IEEE 802.11 device, an IEEE 802.15.4 device, a Wi-Fi device, a WiMAX device, a WAN device, and/or various cellular devices, etc.), and/or the like, which may enable the UE 105 to communicate with other devices as described in the embodiments above. The wireless communication interface 930 may permit data and signaling to be communicated (e.g., transmitted and received) with TRPs of a network, for example, via eNBs, gNBs, ng-eNBs, access points, various base stations and/or other access node types, and/or other network components, computer systems, and/or any other electronic devices communicatively coupled with TRPs, as described herein. The communication can be carried out via one or more wireless communication antenna(s) 932 that send and/or receive wireless signals 934. According to some embodiments, the wireless communication antenna(s) 932 may comprise a plurality of discrete antennas, antenna arrays, or any combination thereof. The antenna(s) 932 may be capable of transmitting and receiving wireless signals using beams (e.g., Tx beams and Rx beams). Beam formation may be performed using digital and/or analog beam formation techniques, with respective digital and/or analog circuitry. The wireless communication interface 930 may include such circuitry.

Depending on desired functionality, the wireless communication interface 930 may comprise a separate receiver and transmitter, or any combination of transceivers, transmitters, and/or receivers to communicate with base stations (e.g., ng-eNBs and gNBs) and other terrestrial transceivers, such as wireless devices and access points. The UE 105 may communicate with different data networks that may comprise various network types. For example, a Wireless Wide Area Network (WWAN) may be a CDMA network, a Time Division Multiple Access (TDMA) network, a Frequency Division Multiple Access (FDMA) network, an Orthogonal Frequency Division Multiple Access (OFDMA) network, a Single-Carrier Frequency Division Multiple Access (SC-FDMA) network, a WiMAX (IEEE 802.16) network, and so on. A CDMA network may implement one or more RATs such as CDMA2000®, WCDMA, and so on. CDMA2000® includes IS-95, IS-2000 and/or IS-856 standards. A TDMA network may implement GSM, Digital Advanced Mobile Phone System (D-AMPS), or some other RAT. An OFDMA network may employ LTE, LTE Advanced, 5G NR, and so on. 5G NR, LTE, LTE Advanced, GSM, and WCDMA are described in documents from 3GPP.

CDMA2000@ is described in documents from a consortium named "3rd Generation Partnership Project 2" (3GPP2). 3GPP and 3GPP2 documents are publicly available. A wireless local area network (WLAN) may also be an IEEE 802.11x network, and a wireless personal area network (WPAN) may be a Bluetooth network, an IEEE 802.15x, or some other type of network. The techniques described herein may also be used for any combination of WWAN, WLAN and/or WPAN.

The UE 105 can further include sensor(s) 940. Sensor(s) 940 may comprise, without limitation, one or more inertial sensors and/or other sensors (e.g., accelerometer(s), gyroscope(s), camera(s), magnetometer(s), altimeter(s), microphone(s), proximity sensor(s), light sensor(s), barometer(s), and the like), some of which may be used to obtain position-related measurements and/or other information.

Embodiments of the UE 105 may also include a Global Navigation Satellite System (GNSS) receiver 980 capable of receiving signals 984 from one or more GNSS satellites using an antenna 982 (which could be the same as antenna 932). Positioning based on GNSS signal measurement can be utilized to complement and/or incorporate the techniques described herein. The GNSS receiver 980 can extract a position of the UE 105, using conventional techniques, from GNSS satellites 110 of a GNSS system, such as Global Positioning System (GPS), Galileo, GLONASS, Quasi-Zenith Satellite System (QZSS) over Japan, IRNSS over India, BeiDou Navigation Satellite System (BDS) over China, and/or the like. Moreover, the GNSS receiver 980 can be used with various augmentation systems (e.g., a Satellite Based Augmentation System (SBAS)) that may be associated with or otherwise enabled for use with one or more global and/or regional navigation satellite systems, such as, e.g., Wide Area Augmentation System (WAAS), European Geostationary Navigation Overlay Service (EGNOS), Multi-functional Satellite Augmentation System (MSAS), and Geo Augmented Navigation system (GAGAN), and/or the like.

It can be noted that, although GNSS receiver 980 is illustrated in FIG. 9 as a distinct component, embodiments are not so limited. As used herein, the term "GNSS receiver" may comprise hardware and/or software components configured to obtain GNSS measurements (measurements from GNSS satellites). In some embodiments, therefore, the GNSS receiver may comprise a measurement engine executed (as software) by one or more processors, such as processor(s) 910, DSP 920, and/or a processor within the wireless communication interface 930 (e.g., in a modem). A GNSS receiver may optionally also include a positioning engine, which can use GNSS measurements from the measurement engine to determine a position of the GNSS receiver using an Extended Kalman Filter (EKF), Weighted Least Squares (WLS), a hatch filter, particle filter, or the like. The positioning engine may also be executed by one or more processors, such as processor(s) 910 or DSP 920.

The UE 105 may further include and/or be in communication with a memory 960. The memory 960 can include, without limitation, local and/or network accessible storage, a disk drive, a drive array, an optical storage device, a solid-state storage device, such as a random access memory (RAM), and/or a read-only memory (ROM), which can be programmable, flash-updateable, and/or the like. Such storage devices may be configured to implement any appropriate data stores, including without limitation, various file systems, database structures, and/or the like.

The memory 960 of the UE 105 also can comprise software elements (not shown in FIG. 9), including an operating system, device drivers, executable libraries, and/or other code, such as one or more application programs, which may comprise computer programs provided by various embodiments, and/or may be designed to implement methods, and/or configure systems, provided by other embodiments, as described herein. Merely by way of example, one or more procedures described with respect to the method(s) discussed above may be implemented as code and/or instructions in memory 960 that are executable by the UE 105 (and/or processor(s) 910 or DSP 920 within UE 105). In some embodiments, then, such code and/or instructions can be used to configure and/or adapt a general-purpose computer (or other device) to perform one or more operations in accordance with the described methods.

It will be apparent to those skilled in the art that substantial variations may be made in accordance with specific requirements. For example, customized hardware might also be used and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" as used herein, refer to any storage medium that participates in providing data that causes a machine to operate in a specific fashion. In embodiments provided hereinabove, various machine-readable media might be involved in providing instructions/code to processors and/or other device(s) for execution. Additionally or alternatively, the machine-readable media might be used to store and/or carry such instructions/code. In many implementations, a computer-readable medium is a physical and/or tangible storage medium. Such a medium may take many forms, including but not limited to, non-volatile media and volatile media. Common forms of computer-readable media include, for example, magnetic and/or optical media, any other physical medium with patterns of holes, a RAM, a programmable ROM (PROM), erasable PROM (EPROM), a FLASH-EPROM, any other memory chip or cartridge, or any other medium from which a computer can read instructions and/or code.

The methods, systems, and devices discussed herein are examples. Various embodiments may omit, substitute, or add various procedures or components as appropriate. For instance, features described with respect to certain embodiments may be combined in various other embodiments. Different aspects and elements of the embodiments may be combined in a similar manner. The various components of the figures provided herein can be embodied in hardware and/or software. Also, technology evolves and, thus many of the elements are examples that do not limit the scope of the disclosure to those specific examples.

It has proven convenient at times, principally for reasons of common usage, to refer to such signals as bits, information, values, elements, symbols, characters, variables, terms, numbers, numerals, or the like. It should be understood, however, that all of these or similar terms are to be associated with appropriate physical quantities and are merely convenient labels. Unless specifically stated otherwise, as is apparent from the discussion above, it is appreciated that throughout this Specification discussion utilizing terms such as "processing," "computing," "calculating," "determining," "ascertaining," "identifying," "associating," "measuring," "performing," or the like refer to actions or processes of a specific apparatus, such as a special purpose computer or a similar special purpose electronic computing device. In the context of this Specification, therefore, a special purpose computer or a similar special purpose electronic computing device is capable of manipulating or transforming signals, typically represented as physical electronic, electrical, or magnetic quantities within memories, registers, or other information storage devices, transmission devices, or display devices of the special purpose computer or similar special purpose electronic computing device.

Terms, "and" and "or" as used herein, may include a variety of meanings that also is expected to depend, at least in part, upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AA, AAB, AABBCCC, etc.

Having described several embodiments, various modifications, alternative constructions, and equivalents may be used without departing from the scope of the disclosure. For example, the above elements may merely be a component of a larger system, wherein other rules may take precedence over or otherwise modify the application of the various embodiments. Also, a number of steps may be undertaken before, during, or after the above elements are considered. Accordingly, the above description does not limit the scope of the disclosure.

In view of this description embodiments may include different combinations of features. Implementation examples are described in the following numbered clauses:

Clause 1. A method for determining an analog-to-digital converter (ADC) output timing in a user equipment, comprising obtaining a set of ADC samples generated by an ADC based on analog signals and an ADC input clock; generating, at a first time point, a start signal indicating a starting point of capturing the set of ADC samples; synchronizing, at a second time point, the start signal and a system clock; generating, at a third time point, a capturing sample clock for capturing the set of ADC samples; inputting the start signal and the capturing sample clock to a counter to determine a time difference between the second time point and the third time point; and determining the ADC output timing of the set of ADC samples based on the time difference.

Clause 2. The method of clause 1 further comprises generating an ADC input clock based on the system clock.

Clause 3. The method of clause 3, wherein generating the ADC input clock based on the system clock further comprises: multiplying a rate of the system clock by a first predetermined value; and dividing the multiplied system clock rate by a second predetermined value.

Clause 4. The method of clause 4, wherein generating the ADC input clock based on the system clock further comprises: routing the system clock to the ADC based on low voltage differential signaling (LVDS).

Clause 5. The method of clause 4 further comprises resynchronizing the synchronized start signal with an ADC output clock.

Clause 6. The method of clause 5 further comprises generating the capturing sample clock based on combining the resynchronized start signal and the ADC clock using an AND gate.

Clause 7. The method of clause 6 further comprises generating a counter clock for the counter to determine the time difference between the second time point and the third time point, wherein the counter clock is generated based on the system clock.

Clause 8. The method of clause 7 wherein generating the counter clock further comprises multiplying a rate of the system clock by a third predetermined value.

Clause 9. A device comprising: one or more transceivers configured to receive analog signals; an analog-to-digital converter (ADC) configured to generate ADC samples; and one or more processors configured to: obtain a set of ADC samples generated by an ADC based on analog signals and an ADC input clock and generate, at a first time point, a start signal indicating a starting point of capturing the set of ADC samples. The one or more processors may also be configured to synchronize, at a second time point, the start signal and a system clock and generate, at a third time point, a capturing sample clock for capturing the set of ADC samples. The one or more processors may further be configured to input the start signal and the capturing sample clock to a counter to determine a time difference between the second time point and the third time point and determine the ADC output timing of the set of ADC samples based on the time difference.

Clause 10. The device of clause 9, further comprises an ADC input clock generation module, configured to generate an ADC input clock based on the system clock.

Clause 11. The device of clause 10, wherein the ADC input clock generation module is further configured to: multiply a rate of the system clock by a first predetermined value; and divide the multiplied system clock rate by a second predetermined value.

Clause 12. The device of clause 11, wherein the ADC input clock generation module is further configured to: route the system clock to the ADC based on low voltage differential signaling (LVDS).

Clause 13. The device of clause 12, wherein the one or more processors is further configured to: resynchronize the synchronized start signal with an ADC output clock.

Clause 14. The device of clause 13, further comprises an AND gate, configured to generate the capturing sample clock based on combining the resynchronized start signal and the ADC clock.

Clause 15. The device of clause 14, wherein the counter is further configured to generate a counter clock for the counter to determine the time difference between the second time point and the third time point, wherein the counter clock is generated based on the system clock.

Clause 16. The device of clause 15, wherein to generate the counter clock the counter is further configured to multiply a rate of the system clock by a third predetermined value.

Clause 17. A user equipment comprising: means for obtaining a set of ADC samples generated by an ADC based on analog signals and an ADC input clock and means for generating, at a first time point, a start signal indicating a starting point of capturing the set of ADC samples. The UE may also include means for synchronizing, at a second time point, the start signal and a system clock and means for generating, at a third time point, a capturing sample clock for capturing the set of ADC samples. The means may further include means for inputting the start signal and the capturing sample clock to a counter to determine a time difference between the second time point and the third time point and means for determining the ADC output timing of the set of ADC samples based on the time difference.

Clause 18. The user equipment of clause 17 further comprises means for generating an ADC input clock based on the system clock.

Clause 19. The user equipment of clause 18, wherein generating the ADC input clock based on the system clock further comprises: means for multiplying a rate of the system clock by a first predetermined value; and means for dividing the multiplied system clock rate by a second predetermined value.

Clause 20. The user equipment of clause 19, wherein generating the ADC input clock based on the system clock further comprises: means for routing the system clock to the ADC based on low voltage differential signaling (LVDS).

Clause 21. The user equipment of clause 20 further comprises means for resynchronizing the synchronized start signal with an ADC output clock.

Clause 22. The user equipment of clause 21 further comprises means for means for generating the capturing sample clock based on combining the resynchronized start signal and the ADC clock using an AND gate.

Clause 23. The user equipment of clause 22 further comprises means for generating a counter clock for the counter to determine the time difference between the second time point and the third time point, wherein the counter clock is generated based on the system clock.

Clause 24. The user equipment of clause 23 wherein generating the counter clock further comprises means for multiplying a rate of the system clock by a third predetermined value.

What is claimed is:

1. An analog-to-digital converter (ADC) sampling system configured to increase positioning accuracy of an User Equipment (UE), comprising:
   one or more transceivers configured to receive an analog signal used for positioning the UE;
   an ADC configured to generate a set of ADC samples based on the analog signal;
   a first counter configured to determine an ADC output timing of the set of ADC samples based on:
      a start signal indicating a starting point of capturing the set of ADC samples at a first terminal of the first counter, and
      a capturing sample clock for capturing the set of ADC samples at a second terminal of the first counter; and
   a second counter configured to synchronize the start signal and a system clock of the ADC sampling system.

2. The ADC sampling system of claim 1, further comprising:

a phase lock loop configured to generate a counter clock for the first counter based on the system clock, wherein the ADC output timing is determined based on the counter clock, and wherein the analog signal comprises a reference signal configured for determining Round Trip Time-based measurements of the UE.

3. The ADC sampling system of claim 2, wherein the counter clock is generated by multiplying a rate of the system clock by a predetermined value.

4. The ADC sampling system of claim 2, wherein:

the start signal and the system clock is synchronized at a first time point;

the capturing sample clock for capturing the set of ADC samples is generated by a modem at a second time point; and the ADC output timing of the set of ADC samples is determined based on determining a time difference between the second time point and the first time point.

5. The ADC sampling system of claim 4, further comprises an ADC input clock generation module, configured to generate an ADC input clock based on the system clock, wherein the set of ADC samples is generated further based on the ADC input clock.

6. The ADC sampling system of claim 5, wherein the ADC input clock generation module is further configured to:

route the system clock to the ADC based on low voltage differential signaling (LVDS).

7. The ADC sampling system of claim 4, wherein the modem is further configured to:

resynchronize the synchronized start signal with an output clock of the ADC.

8. The ADC sampling system of claim 7, further comprising an AND gate, configured to generate the capturing sample clock based on combining the resynchronized start signal and the output clock of the ADC.

9. A method for increasing positioning accuracy of a User Equipment (UE), performed by an analog-to-digital converter (ADC) sampling system, the method comprising:

receiving, by one or more transceivers, an analog signal used for positioning the UE;

generating, by an analog-to-digital converter (ADC), a set of ADC samples based on the analog signal; and determining, by a first counter, an ADC output timing of the set of ADC samples based on:

a start signal indicating a starting point of capturing the set of ADC samples at a first terminal of the first counter; and a capturing sample clock for capturing the set of ADC samples at a second terminal of the first counter; and synchronizing, using a second counter, the start signal and a system clock of the ADC sampling system.

10. The method of claim 9, further comprising:

generating, by a phase lock loop, a counter clock for the first counter based on the system clock, wherein the ADC output timing is determined based on the counter clock, and wherein the analog signal comprises a reference signal configured for determining Round Trip Time-based measurements of the UE.

11. The method of claim 10, wherein the counter clock is generated by multiplying a rate of the system clock by a predetermined value.

12. The method of claim 10, wherein:

the start signal is synchronized at a first time point;

the capturing sample clock for capturing the set of ADC samples is generated by a modem at a second time point; and the ADC output timing of the set of ADC samples is determined based on determining a time difference between the second time point and the first time point.

13. The method of claim 12, further comprises:

generating, by an ADC input clock generation module, an ADC input clock based on the system clock, wherein the set of ADC samples is generated further based on the ADC input clock.

14. The method of claim 13, further comprises:

route, by the ADC input clock generation module, the system clock to the ADC based on low voltage differential signaling (LVDS).

15. The method of claim 12, further comprising:

resynchronizing, by the modem, the synchronized start signal with an output clock of the ADC.

16. The method of claim 15, further comprising:

generating, by an AND gate, the capturing sample clock based on combining the resynchronized start signal and the output clock of the ADC.

17. An apparatus configured to increase positioning accuracy of an User Equipment (UE), comprising:

means for receiving an analog signal used for positioning the UE;

means for generating a set of analog-to-digital converter (ADC) samples based on the analog signal; and means for determining an ADC output timing of the set of ADC samples based on:

a start signal indicating a starting point of capturing the set of ADC samples at a first terminal of a first counter; and a capturing sample clock for capturing the set of ADC samples at a second terminal of the first counter; and means for synchronizing the start signal and a system clock of the apparatus.

18. The apparatus of claim 17, further comprising:

means for generating a counter clock based on the system clock, wherein the ADC output timing is determined based on the counter clock, and wherein the analog signal comprises a reference signal configured for determining Round Trip Time-based measurements of the UE.

19. The apparatus of claim 18, wherein the counter clock is generated by multiplying a rate of the system clock by a predetermined value.

20. The apparatus of claim 18, wherein:

the start signal is synchronized at a first time point;

the capturing sample clock for capturing the set of ADC samples is generated at a second time point; and the ADC output timing of the set of ADC samples is determined based on determining a time difference between the second time point and the first time point.

* * * * *